US012787308B2

(12) United States Patent
Chiang et al.

(10) Patent No.: US 12,787,308 B2

(45) Date of Patent: Nov. 3, 2026

(54) SEMICONDUCTOR DEVICE

(71) Applicant: Taiwan Semiconductor Manufacturing Company, Ltd., Hsinchu (TW)

(72) Inventors: Yun-Chi Chiang, Hsinchu City (TW); Meng-Pei Lu, Hsinchu City (TW); Shin-Yi Yang, New Taipei City (TW); Cian-Yu Chen, Taichung City (TW); Chien-Hsin Ho, Taichung City (TW); Ming-Han Lee, Taipei City (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 460 days.

(21) Appl. No.: 18/480,473

(22) Filed: Oct. 3, 2023

(65) Prior Publication Data

US 2025/0113499 A1 Apr. 3, 2025

(51) Int. Cl.

| | |
|---|---|
| ***H10D 1/20*** | (2025.01) |
| ***H01F 17/00*** | (2006.01) |
| ***H01F 27/24*** | (2006.01) |
| ***H01F 27/28*** | (2006.01) |
| ***H10W 20/40*** | (2026.01) |

(52) U.S. Cl.

CPC ........... *H10D 1/20* (2025.01); *H01F 17/0013* (2013.01); *H01F 27/24* (2013.01); *H01F 27/2823* (2013.01); *H10W 20/497* (2026.01); *H01F 2017/0086* (2013.01)

(58) Field of Classification Search

CPC ... H10D 1/20; H01F 17/0013; H01F 27/2823; H01F 27/24; H01F 2017/0086; H01F 27/2866; H10W 20/497; H01L 23/5227; H01Q 7/08

See application file for complete search history.

(56) References Cited

U.S. PATENT DOCUMENTS

2004/0175926 A1* 9/2004 Wang ................ H01L 21/76846 438/627
2018/0308615 A1* 10/2018 Tsai ........................ H01F 27/24
2019/0109185 A1* 4/2019 Lee ........................ H10D 86/85

FOREIGN PATENT DOCUMENTS

JP H08233865 * 9/1996 ............. G01R 15/20
WO WO-2008118489 A1 * 10/2008 ........... H01L 23/645

* cited by examiner

*Primary Examiner* — Galina G Yushina

(74) *Attorney, Agent, or Firm* — JCIPRNET

(57) ABSTRACT

A semiconductor device including a substrate, a magnetic core and a conductor coil is provided. The magnetic core is disposed on the substrate, and formed by sub-layers of different materials stacked alternatively on one another. The conductor coil is disposed on the substrate, wherein the magnetic core partially extends to a level between an upper surface of the conductor coil and a bottom surface of the conductor coil.

20 Claims, 21 Drawing Sheets

600

SEMICONDUCTOR DEVICE

BACKGROUND

The semiconductor industry has experienced rapid growth, due in part to ongoing improvements in the integration density of a variety of electronic components (e.g., transistors, diodes, resistors, capacitors, etc.). For the most part, improvements in integration density have resulted from iterative reduction of minimum feature size, which allows more components to be integrated into a given area. As the demand for smaller electronic devices has increased, a need for more space-efficient and creative packaging techniques for semiconductor die structures has emerged.

DESCRIPTION OF THE EMBODIMENTS

Figure 1:
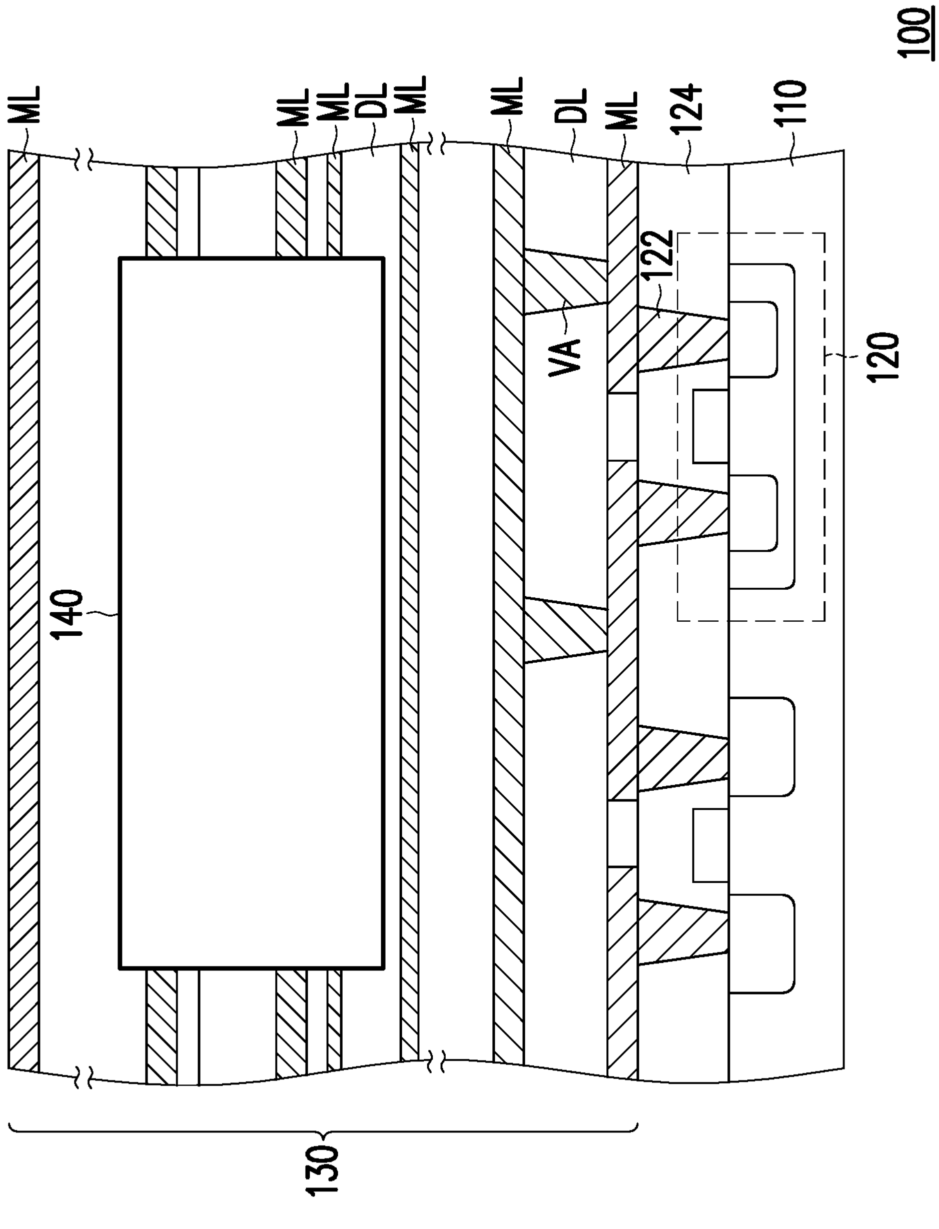
FIG. 1 schematically illustrates a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a semiconductor device in accordance with some embodiments of the disclosure. A semiconductor device 100 in FIG. 1 includes a substrate 110, a semiconductor component 120, and an interconnect structure 130 and an embedded inductor 140. The semiconductor component 120 is disposed on the substrate 110 and fabricated by using manufacturing processes of front-end-of-the-line (FEOL) in a semiconductor manufacture field. The interconnect structure 130 is disposed on the substrate 110 and fabricated by using manufacturing processes of middle-end-of-the-line (MEOL) in the semiconductor manufacture field. The interconnect structure 130 may establish electrical transmission for the semiconductor component 120 and the embedded inductor 140 is disposed within and/or embedded in the interconnect structure 130.

In some embodiments, the substrate 110 may be a silicon substrate or a semiconductor substrate formed of other semiconductor materials. For example, the material of the substrate 110 may include silicon, silicon germanium, silicon carbon, III-V compound semiconductor material, or the like. In some embodiments, the substrate 110 is lightly doped with a p-type impurity, but the present disclosure is not limited thereto. In some embodiments, the substrate 110 may include a silicon on insulator (SOI) structure. In detail, the SOI structure may have a layer of a semiconductor material, such as silicon, formed on an insulator layer. The insulator layer may include a buried oxide (BOX) layer and/or a silicon oxide layer. It is noted that the substrate 110 may include another elementary semiconductor, such as germanium, a compound semiconductor including silicon carbide, gallium arsenic, gallium phosphide, indium phosphide, indium arsenide and indium antimonide, an alloy semiconductor including SiGe, GaAsP, AlInAs, AlGaAs, GaInAs, GaInP and GaInAsP, or combinations thereof. Additionally, other types of substrates, such as a multilayer substrate, a gradient substrate, or combinations thereof, may also be adopted.

The semiconductor component 120 may include transistors, diodes, resistors, CMOS devices or the like. In some embodiments, a contact structure 122 and a pre-metal dielectric layer 124 may be further fabricated by using manufacturing processes of FEOL in a semiconductor manufacture field. The contact structure 122 is used for connecting the semiconductor component 120 to the interconnect structure 130. In some embodiments, the pre-metal dielectric layer 124 may be disposed on the substrate 110 to cover the semiconductor component 120 and the contact structure 122 is formed extending through the pre-metal dielectric layer 124.

The interconnect structure 130 includes metal layers ML and interlayer dielectric layers DL alternately disposed on the semiconductor structure 110. The interconnect structure 130 may further include vias VA that connect different layers of the metal layers ML to create the required electric transmission route. In some embodiments, the interconnect structure 130 may be formed by damascene process, dual-damascene process, combinations thereof, or the like. For example, a trench etching process may be conducted to form a plurality of trenches. Subsequently, a metallic material such as Cu, Al, Ag, Au, W, Mo, Ru, Co, Ni, Pd, Pt, other metals or their alloys may be provided in the trenches as a medium for electrical transmission. In some embodiments, a planarization process may be conducted to remove exceeded metallic material over the trench. The embedded inductor 140 may be included in the interconnect structure 130 and fabricated by using manufacturing processes compatible to MEOL in the semiconductor manufacture field. In some embodiments, the embedded inductor 140 may be fabricated by using the damascene process, dual-damascene process, combinations thereof, or the like. In some embodiments, the interconnect structure 130 includes electric transmission routings formed by the metal layers ML and a portion of the embedded inductor 140 may be fabricated simultaneously with the metal layers ML. Therefore, the semiconductor device 100 has the embedded inductor 140 to achieve the increased integration density of a variety of electronic components.

Figure 2:
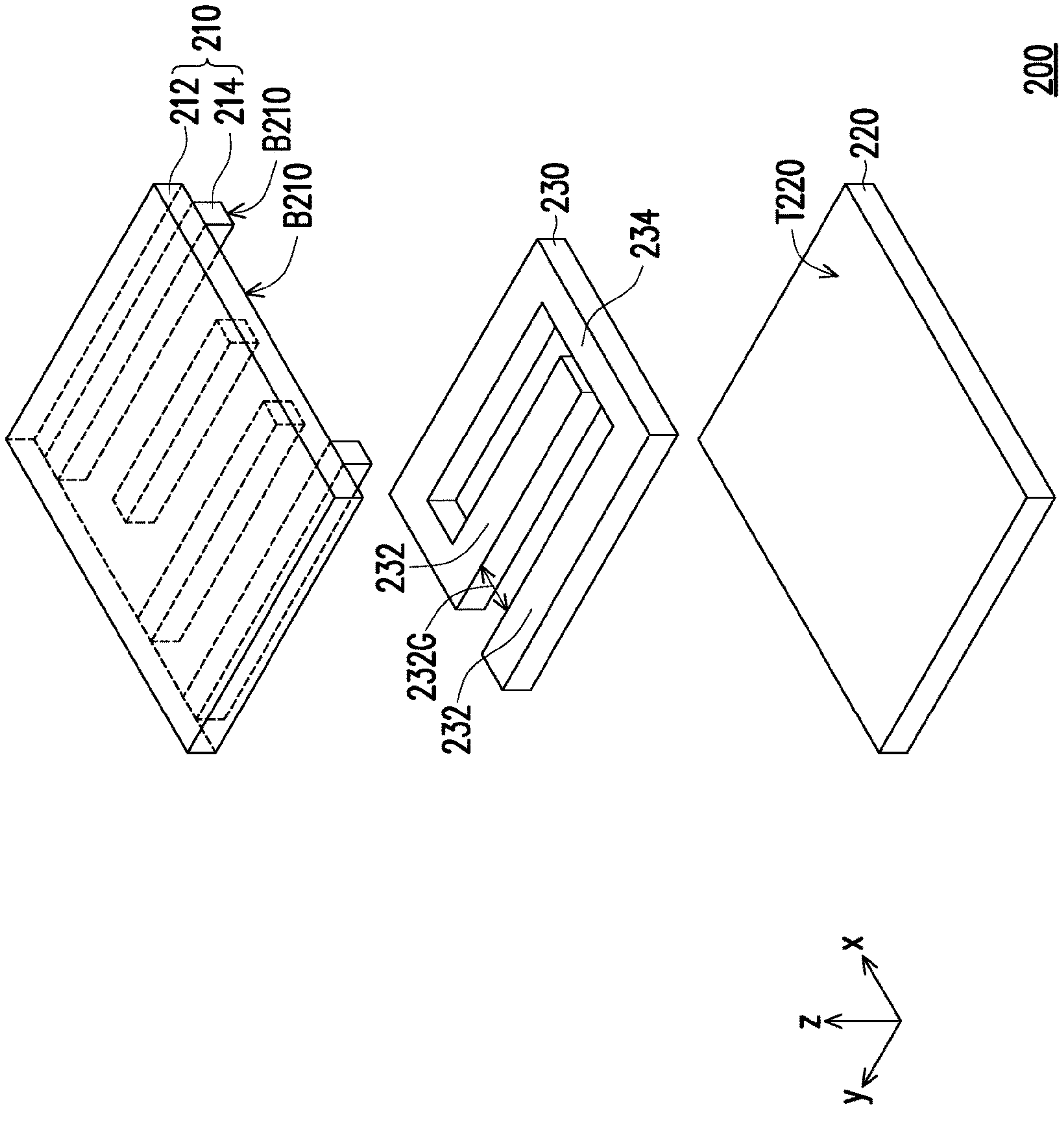
FIG. 2 schematically illustrates an exploded view of an embedded inductor in accordance with some embodiments of the disclosure.
Figure 3:
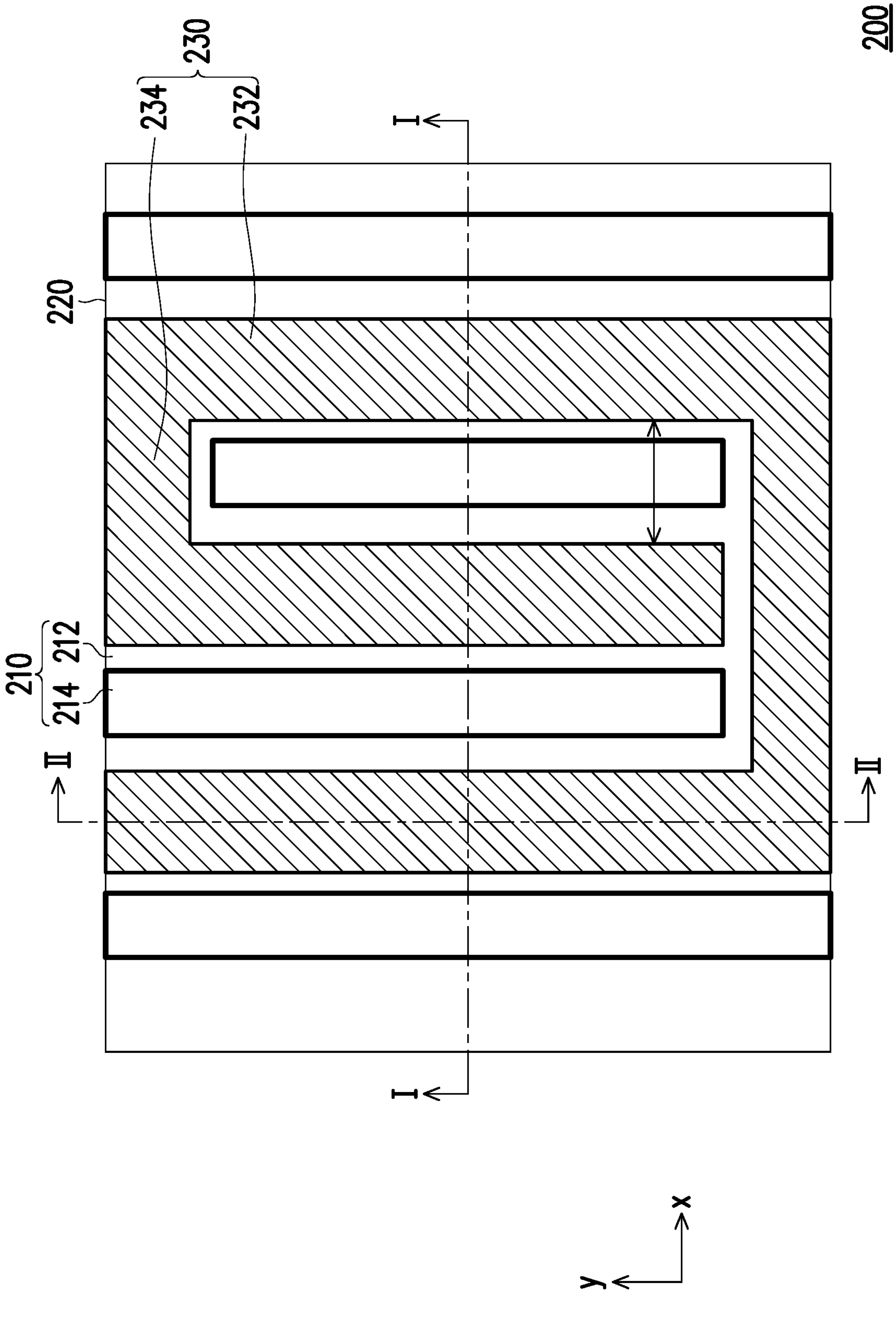
FIG. 3 schematically illustrates a top view of an embedded inductor in accordance with some embodiments of the disclosure.
Figure 4:
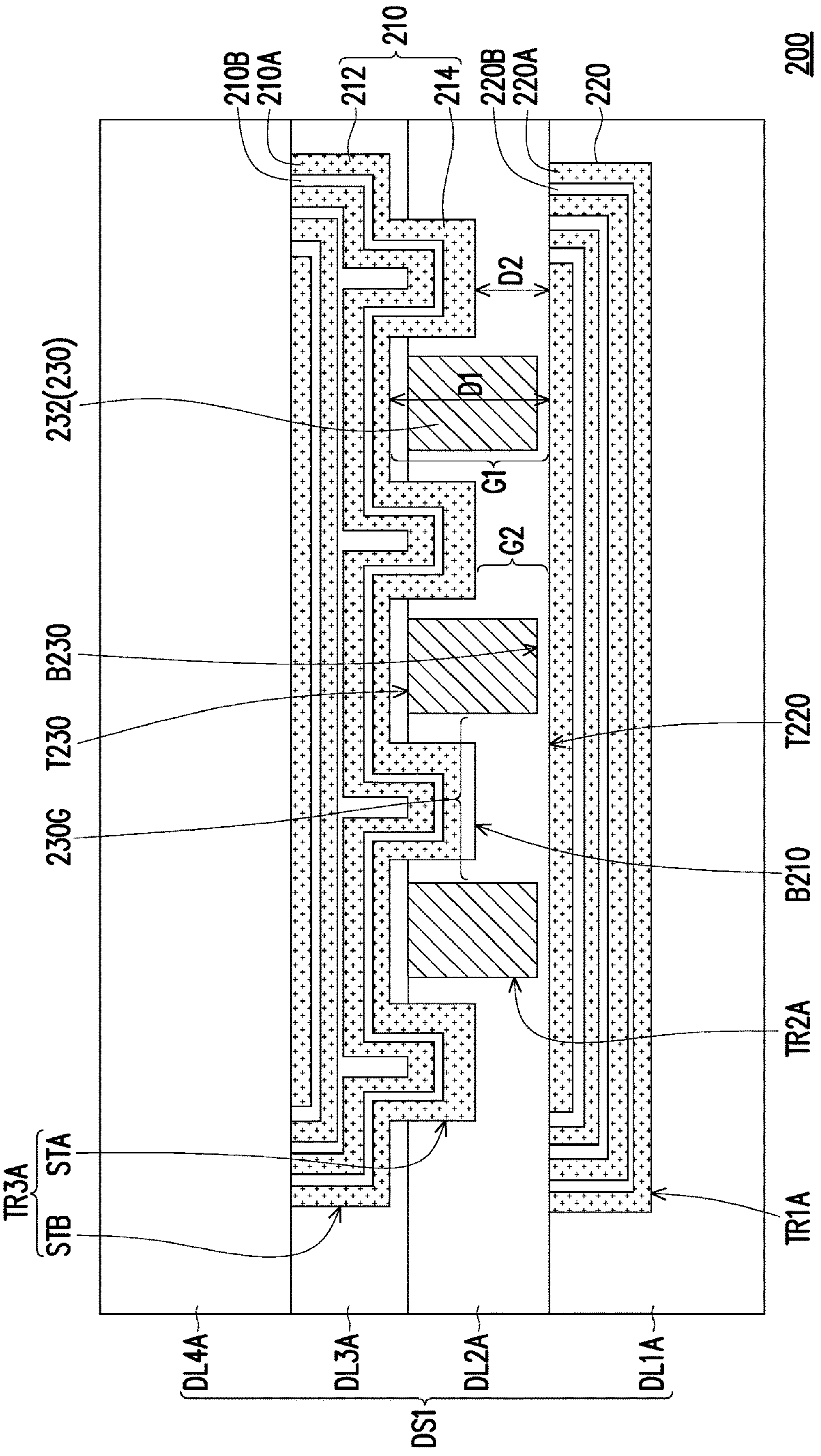
FIG. 4 schematically illustrates a cross sectional view of an embedded inductor, taken along line I-I of FIG. 3 in accordance with some embodiments of the disclosure.
Figure 5:
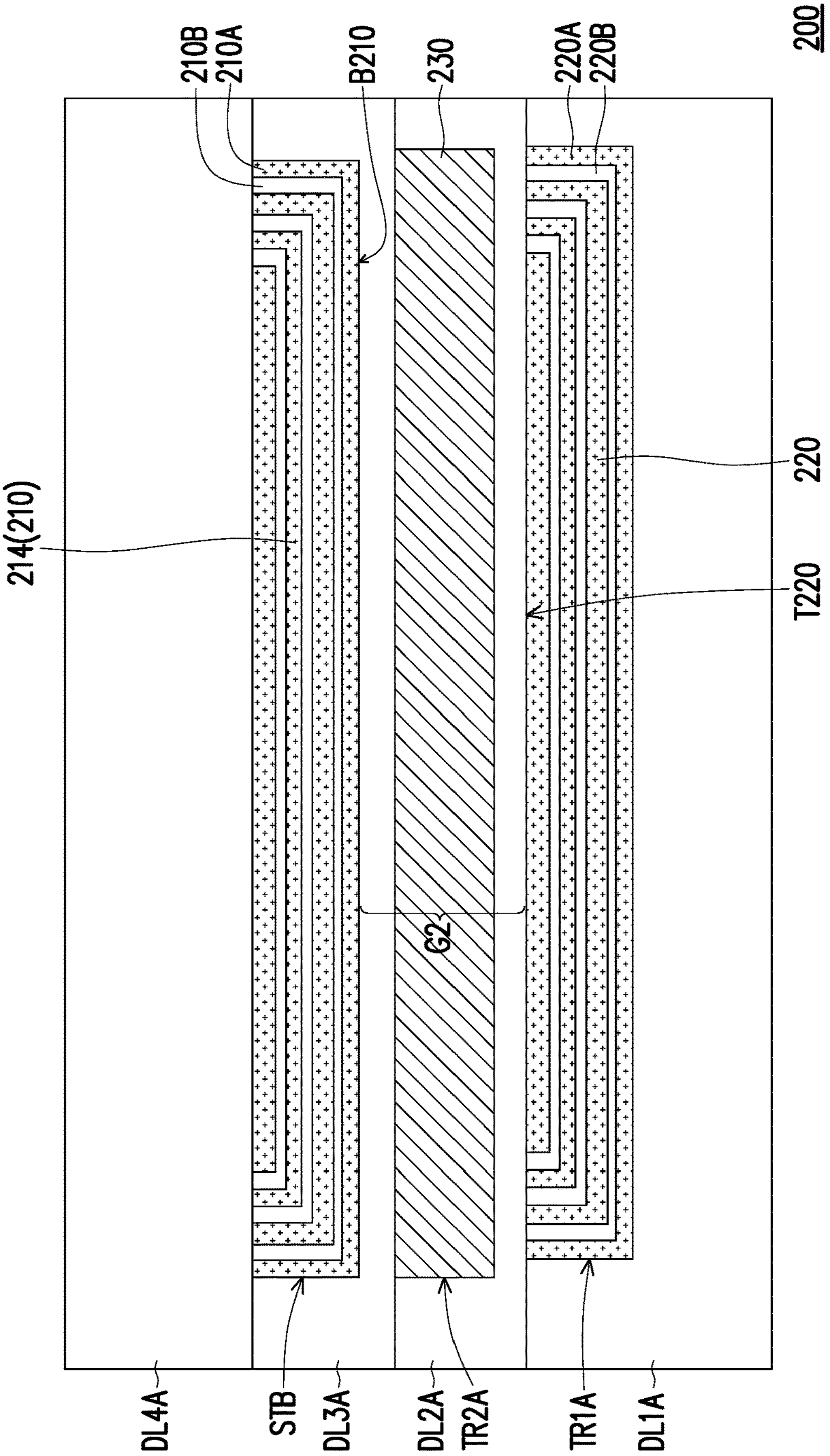
FIG. 5 schematically illustrates a cross sectional view of an embedded inductor, taken along line II-II of FIG. 3 in accordance with some embodiments of the disclosure.

FIGS. 2-5 schematically illustrate an embedded inductor in accordance with some embodiments of the disclosure. Specifically, FIG. 2 presents an exploded view showing each of the elements of an embedded inductor. FIG. 3 presents a top view of an embedded inductor. FIG. 4 presents a cross sectional view of the embedded inductor taken along line I-I of FIG. 3. FIG. 5 presents a cross sectional view of the embedded inductor taken along line II-II of FIG. 3. Referring FIGS. 2-5, an embedded inductor 200 includes a first magnetic core 210, a second magnetic core 220 and a conductor coil 230. The embedded inductor 200 may be disposed in the semiconductor device 100 show in FIG. 1 and serve as an exemplary implement of the embedded inductor 140. Accordingly, in some embodiments, the first magnetic core 210, the second magnetic core 220 and the conductor wire 230 are disposed on the substrate 110 depicted in FIG. 1. In some embodiments, the conductor coil 230 may be of the same layer as one or more of the metal layers ML in the interconnect structure 130 depicted in FIG. 1.

As shown in FIG. 3, the conductor coil 230 is disposed between the first magnetic core 210 and the second magnetic core 220 and thus the second magnetic core 220, the conductor coil 230 and the first magnetic core 210 are sequentially arranged along Z-axis. In some embodiments, the first magnetic core 210 may include a main portion 212 and one or more protrusions 214 protruded from the main portion 212 toward the second magnetic core 220. The main portion 212 is a plane portion that overlaps the conductor coil 230. Therefore, the first magnetic core 210 may have a staggered surface B210 facing the conductor coil 230 and the second magnetic core 220, and the staggered surface B210 is the bottom surface of the first magnetic core 210 under the orientation shown in FIG. 2. The protrusion 214 presented in FIG. 3 is a linear structure, but the disclosure is not limited thereto. The second magnetic core 220 is a flat magnetic structure located below the conductor coil 220 such that the conductor coil 220 is located between the first magnetic core 210 and the second magnetic core 220. The second magnetic core 220 has a flat surface T220 facing the conductor coil 230 and the first magnetic core 210, and the flat surface T220 is the upper surface of the second magnetic core 220 under the orientation shown in FIG. 2. In some embodiments, the second magnetic core 220 may be parallel to the main portion 212 of the first magnetic core 210. The first magnetic core 210 and the second magnetic core 220 are asymmetric about the conductor coil 230, which facilitates anisotropic induction effect.

The conductive coil 230 located between the first magnetic core 210 and the second magnetic core 220 is a coil structure. In some embodiments, the conductor coil 230 is made of conductive material such as Cu, Al, Ag, Au, W, Mo, Ru, Co, Ni, Pd, Pt, other metals, or their alloys; or the material for forming the metal layers ML in the interconnect structure 130 depicted in FIG. 1. The conductive coil 230 may be wounded along a coil path on the plane of X-axis and Y-axis to form a 2D (two dimensional) coil structure. In some embodiments, the plane of X-axis and Y-axis is parallel to the substrate 110 presented in FIG. 1, but the disclosure is not limited thereto. The conductor coil 230 includes first wire sections 232 and second wire sections 234. In some embodiments, the first wire sections 232 are wires that extend linearly along Y-axis and are parallel to each other and the second wire sections 234 are wires that extend linearly along X-axis and are parallel to each other. Two terminals of each of the second wire sections 234 are connected to two of the first wire sections 232 to form the conductor coil 230 having a 2D coil structure.

The first wire sections 232 are spaced from each other by a gap space 230G and the protrusion 214 of the first magnetic core 210 is located within the gap space 230G. In the embedded inductor 200, the first wire sections 232 of the conductor coil 230 and the protrusions 214 of the first magnetic core 210 are arranged alternatively along X-axis. In some embodiments, the gap space 230G may extend along a coil path complementary to the path of the conductor coil 230 and the protrusion 214 may also arranged along the gap space 230G to have a coil-shape top view. For illustration purpose, the conductor coil 230 is presented as a rectangular coil in which the wire sections are straight lines, but the disclosure is not limited thereto. In some embodiments, the conductor coil 230 may be a circular coil. The protrusion 214 is presented as a linear structure as an example so that the dimension of the protrusion 214 in X-axis is obviously smaller than that in Y-axis. In some embodiments, the protrusion 214 may have similar dimensions in X-axis and Y-axis to have a dot-like structure.

In FIG. 3, the top view of the embedded conductor 200 shows that the first magnetic core 210, the second magnetic core 220 and the conductor wire 230 are overlapped. In some embodiments, the top view size, e.g. the area at the plane of X-axis and Y-axis, of the second magnetic core 220 is substantially identical to the main portion 212 of the first magnetic core 210, but the disclosure is not limited thereto. The protrusion 214 of the first magnetic core 210 extends in the Y-axis to have a linear top view pattern. The first magnetic core 210 may have multiple protrusions 214 that are arranged parallel to each other in the top view and are not overlapped with the conductor coil 230. In some embodiments, the first magnetic core 210 may have a coil-shaped protrusion that is arranged along the gap space 230G.

FIG. 4 and FIG. 5 present cross sectional views of the embedded inductor 200 taken along lines I-I and II-II in FIG. 3. The embedded inductor 200 is embedded in the dielectric structure DS1 that may include multiple dielectric layers DL1A~DL4A. The dielectric layers DL1A~DL4A may be the interlayer dielectric layers DL in the interconnect structure 130 depicted in FIG. 1. Therefore, the embedded inductor 200 is a passive component embedded in the interconnect structure 130 of the semiconductor device 100, which facilitates an increased integration density of the semiconductor device 100. In FIG. 4 and FIG. 5, the dielectric layers DL1A~DL4A are sequentially stacked in Z-axis, the second magnetic core 220 is disposed on the dielectric layer DL1A, the conductor coil 230 is disposed on the dielectric layer DL2A, the first magnetic core 210 is disposed on the dielectric layer DL3A and the dielectric layer DL4A covers the first magnetic core 210.

In some embodiments, the material of the dielectric layers DL1A~DL4A may include metal oxides, metal nitrides and metal carbides; or metalloid oxides, metalloid nitrides and metalloid carbides, such as AlNx, AlOx, SixCyNz, SixOyCz. In some embodiments, the material of the dielectric layers DL1A~DL4A may include polymer-based dielectric layer, such as Polyimides, Polysilsesquioxanes, $(RSiO_{3/2})_n$, where R may be hydrogen, alkyl, aryl and other organic segments, fluorinated polymers, or other porous silicon-containing polymeric materials. The thickness of dielectric layers DL1A~DL4A may be 10 Å to hundreds μm. The dielectric layers DL1A~DL4A may be deposited by ALD, CVD, PVD, PE-ALD (plasma enhanced), PE-CVD, MOCVD, spin-coating and other suitable processes that are compatible to semiconductor manufacturing processes.

The embedded inductor 200 may be fabricated by using damascene process or similar process that is compatible to the process of fabricating the interconnect structure. For example, the second magnetic core 220 may be formed by forming the dielectric layer DL1 on the substrate 110 shown in FIG. 1, forming a trench TR1A by etching/removing a portion of the dielectric layer DL1A, depositing the material of the second magnetic core 220 on the dielectric layer DL1A, and performing a planarization process such as polishing or grinding process to remove exceeded material of the second magnetic core 220 on the dielectric layer DL1 so that the second magnetic core 220 inlayed in the dielectric layer DL1A is formed.

The second magnetic core 220 may be formed by sub-layers of different materials stacked alternatively on one another to have a multi-layer structure. For example, the second magnetic core 220 includes first sub-layers 220A and second sub-layers 220B, the first sub-layers 220A are made of a material different from the second sub-layers 220B, and the first sub-layers 220A and the second sub-layers 220B are alternatively stacked on one another. Accordingly, adjacent two of the sub-layers of different materials are made of different material. In some embodiments, the materials of the first sub-layers 220A and the second sub-layers 220B are alternatively deposited on the dielectric layer DL1 and then subjected to the planarization process so that the first sub-layers 220A and the second sub-layers 220B may extend along the trench TR1A to have U-shape cross sections. The first sub-layers 220A and the second sub-layers 220B of different materials may extend to a same level at a flat surface T220 of the second magnetic core 220. In addition, the flat surface T220 of the second magnetic core 220 is co-leveled with the upper surface of the dielectric layer DL1A.

The dielectric layer DL2A is disposed on the second magnetic core 220 and the dielectric layer DL1A. A trench TR2A is form on the dielectric layer DL2A by etching process for fabricating the conductor coil 230. In some embodiments, the material of the conductor coil 230 is deposited on the dielectric layer DL2A and fills the trench TR2A. Subsequently, the exceeded material of the conductor coil 230 is removed through a planarization process to form the conductor coil 230. The conductor coil 230 may have an upper surface T230 co-leveled with the dielectric layer DL2A. In some embodiments, material for the conductor coil 230 may be metals with low resistivity and large skin depth that are suitable for AC conducting application, ex. Cu, Al, Ag, Au, W, Mo, Ru, Co, Ni, Pd, Pt and other metals and their alloys. In some embodiments, the cross-section of conductor coil 230 may be circle, semi-circle, oval, square, or rectangle with dimension from 10 Å to few μm. In some embodiments, the conductor coil 230 may be Litz wire, which consists of multiple strands insulated from each other, wherein the inner strands may have a dimension from 10 Å to few μm. In some embodiments, one or more layers of diffusion barrier may be applied for the stability and reliability of the conductor coil 230, wherein the barrier materials include but not limited to metal-nitrides, -carbides and -oxides, such as TiN, TaN, WC, WN, MoN, MoC, InO, AlN, AlO, MnN, MnO. The conductor coil 230 may include a liner, and the material of the liner may be metals including, but not limited to, W, Mo, Ta, Ti, Co, Ru, Pd, Pt, Al, other metals, or their alloys. The conductor coil 230 may be patterned by suitable processes that is compatible to semiconductor manufacturing processes, such as single and dual damascene processes, or subtractive processes. In some embodiments, the conductor coil 230 may be gap-filled (damascene) or deposited (subtractive) by ALD, CVD, PVD, PE-ALD (plasma enhanced), PE-CVD, MOCVD, MBD (Molecular beam deposition), IBD (ion beam deposition), ECP (electroplating), ELD (electroless plating) and other suitable processes that are compatible to semiconductor manufacturing processes.

The dielectric layer DL3A is disposed on the conductor coil 220 and the dielectric layer DL2A and a trench TR3A is formed by an etching process. The trench TR3A has two stairs STA and STB, the stair STA extends in the dielectric layer DL3A and the stair STB extends in dielectric layer DL2A to be lower than the upper surface T230 of the conductor coil 230. The first magnetic core 210 is formed in the trench TR3A to have the staggered surface B210 facing the conductor coil 230. In addition, the second magnetic core 220 has the flat surface T220 facing the conductor coil 230. The first magnetic core 210 and the second magnetic core 220 have asymmetric structure about the conductive coil 230.

The first magnetic core 210, similar to the second magnetic core 220, may be formed by sub-layers of different materials stacked alternatively on one another to have a multi-layer structure. For example, the first magnetic core 210 includes first sub-layers 210A and second sub-layers 210B, the first sub-layers 210A are made of a material different from the second sub-layers 210B, and the first sub-layers 210A and the second sub-layers 210B are alternatively stacked on one another. The materials of the first sub-layers 210A and the second sub-layers 210B are alternatively deposited on the dielectric layer DL3 and then subjected to the planarization process. A portion of the first sub-layers 210A and the second sub-layers 210B extends in the stair STA of the trench TR3A may construct the protrusion 214 of the first magnetic core 210 and each of the first sub-layers 210A and the second sub-layers 210B constructing the protrusion 214 has a U-shape cross section. The U-shape cross sections of the first sub-layers 210A and the second sub-layers 210B may extend the level lower than the upper surface T230 of the conductor coil 230. In addition, the first sub-layers 210A and the second sub-layers 210B of different materials may extend to a same level at the upper surface T210 of the first magnetic core 210, wherein the upper surface T210 of the first magnetic core 210 is co-leveled with the upper surface of the dielectric layer DL3.

The first magnetic core 210 and the second magnetic core 220 are formed on multi-layer structure. In some embodiments, a thickness of each of the sub-layers of different materials forming the first magnetic core 210 and the second magnetic core 220 is ranged from 1 Å to 100 μm. A thickness ratio of one sub-layer of a first material to another sub-layer of a second material may be ranged from 1:1 to 1:1000. For example, in the first magnetic core 210, a thickness of each of the first sub-layer 210A and the second sub-layer 210B may be ranged from 1 Å to 100 μm, and the first sub-layer 210A and the second sub-layer 210B may have a thickness ratio ranged from 1:1 to 1:1000. Similarly, in the second magnetic core 220, a thickness of each of the first sub-layer 220A and the second sub-layer 220B may be ranged from 1 Å to 100 μm, and the first sub-layer 220A and the second sub-layer 220B may have a thickness ratio ranged from 1:1 to 1:1000.

The sub-layers of different materials forming the first magnetic core 210 and the second magnetic core 220 may be deposited by ALD, CVD, PVD, PE-ALD (plasma enhanced), PE-CVD, MOCVD, MBD (Molecular beam deposition), IBD (ion beam deposition) and other suitable processes that are compatible to semiconductor manufacturing processes. In some embodiments, the sub-layers of different materials forming the first magnetic core 210 and the second magnetic core 220 may include sub-layers of insulating material, sub-layers of conductive material, sub-layers of magnetic material, or a combination thereof. The sub-layers of different materials forming the first magnetic core 210 and the second magnetic core 220 may include, but not limited to, multiple sets of one layer of magnetic material and one layer of insulating material; or multiple sets of two layers of different magnetic materials and one layer of insulating material. The sub-layers of different materials forming the first magnetic core 210 and the second magnetic core 220 may include, but not limited to, multiple sets of two layers of different magnetic materials, or multiple sets of three layers of different magnetic materials. The sub-layers of different materials forming the first magnetic core 210 and the second magnetic core 220 may include, but not limited to, multiple sets of one layer of magnetic material, one layer of conductive material such as metal, and one layer of insulating material; or multiple sets of two layers of different magnetic materials, one layer of conductive material such as metal, and one layer of insulating material.

In some embodiments, the sub-layers of magnetic material forming the first magnetic core 210 and the second magnetic core 220 may include sub-layers of ferromagnetic material, sub-layers of ferrite material, sub-layers of Heusler compounds, sub-layers of lanthanide elements, sub-layers of actinide element, or sub-layers of an oxide of ferromagnetic material. For example, the magnetic material may be: ferromagnetic materials such as Fc, Ni, Co, Fe—Co, Fe—Ni, Co—Ni and their alloys; iron oxides, nickel oxides, cobalt oxides and their mixture with other metal oxides; elements of lanthanide and actinide; Co—Zr, Co—Zr—Ta, Co—Nb—Zr and their alloys; ferrite materials including metal element such as Ni, Mg, Zn, Fe, Cu, Co, Ba, or Sr; or Heusler compounds, such as $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Co_2NiGa$, $Pd_2MnAl$, $Pd_2MnIn$, $Pd_2MnSn$, $Pd_2MnSb$, $Co_2FeSi$, $Co_2FcAl$, $Fc_2VAl$, $Mn_2VGa$, $Co_2FeGe$, $Co_2Cr_xFc_{1-x}Al$, or $Co_2Cr_xFe_{1-x}Si$. In some embodiments, the first magnetic core 210 and the second magnetic core 220 may include hybrid materials that laminated with the abovementioned magnetic materials, such as materials including Pt, Pd, W, Cc. Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fc_2O_3$, Nd, $Nd_2O_3$, $KO_2$, Pr, Sm, $Sm_2O_3$, Tb, $Tb_2O_3$, $Tm_2O_3$, V, or $V_2O_3$, epoxy material with particle of a magnetic alloy, or dielectric materials with magnetic particles or flakes. In addition, the sub-layers of conductive material forming the first magnetic core 210 and the second magnetic core 220 may include but not limited to Cu, Ag. Au, Al, Pd, Pt, Ru, Rh, Ir, Os and other transition metal alloys.

As shown in FIG. 4 and FIG. 5, the embedded inductor 200 that is applicable to the semiconductor device 100 shown in FIG. 1 includes the first magnetic core 210, the second magnetic core 220 and the conductor coil 230. A first gap region G1 and second gap region G2 are defined between the first magnetic core 210 and the second magnetic core 220, a spacing distance D1 between the first magnetic core 210 and the second magnetic core 220 in the first gap region G1 is greater than a spacing distance D2 between the first magnetic core 210 and the second magnetic core 220 in the second gap region G2. The conductor coil 230 is located within the first gap region G1, and the protrusion 214 of the first magnetic core 210 is located within the second gap region G2. In addition, the wire sections 232 of the conductor coil 230 are laterally separated from each other by a gap space 230G and the protrusion 214 of the first magnetic core 210 is located within the gap space 230G. The first magnetic core 210 has a staggered surface B210 facing the second magnetic core 220 and the second magnetic core 220 has a flat surface T220 facing the first magnetic core 210. In some embodiments, the protrusion 214 of the first magnetic core 210 extend to a level that is between the upper surface T230 and the bottom surface B230 of the conductor coil 230.

Figure 6:
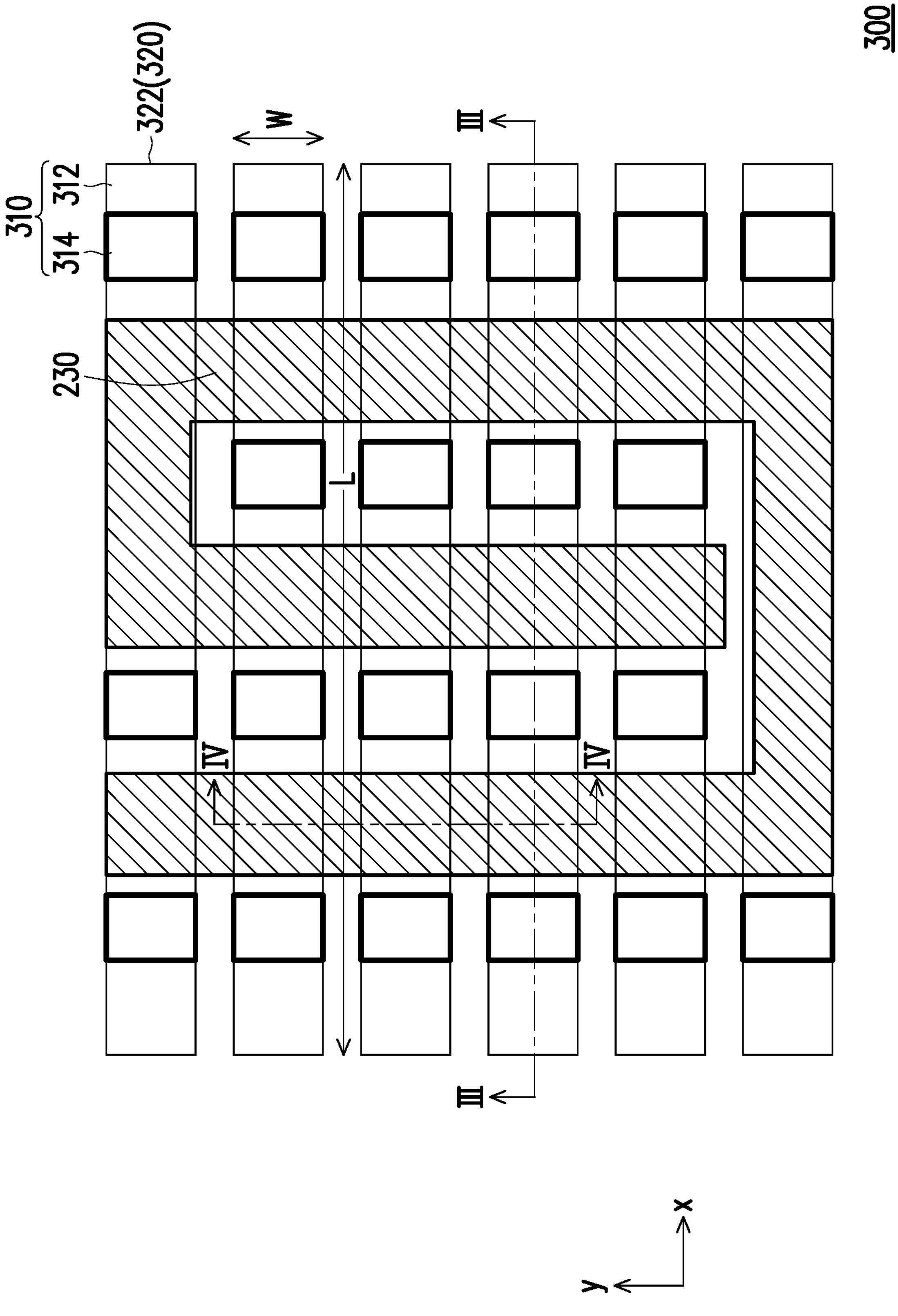
FIG. 6 schematically illustrates a top view of an embedded inductor in accordance with some embodiments of the disclosure.
Figure 7:
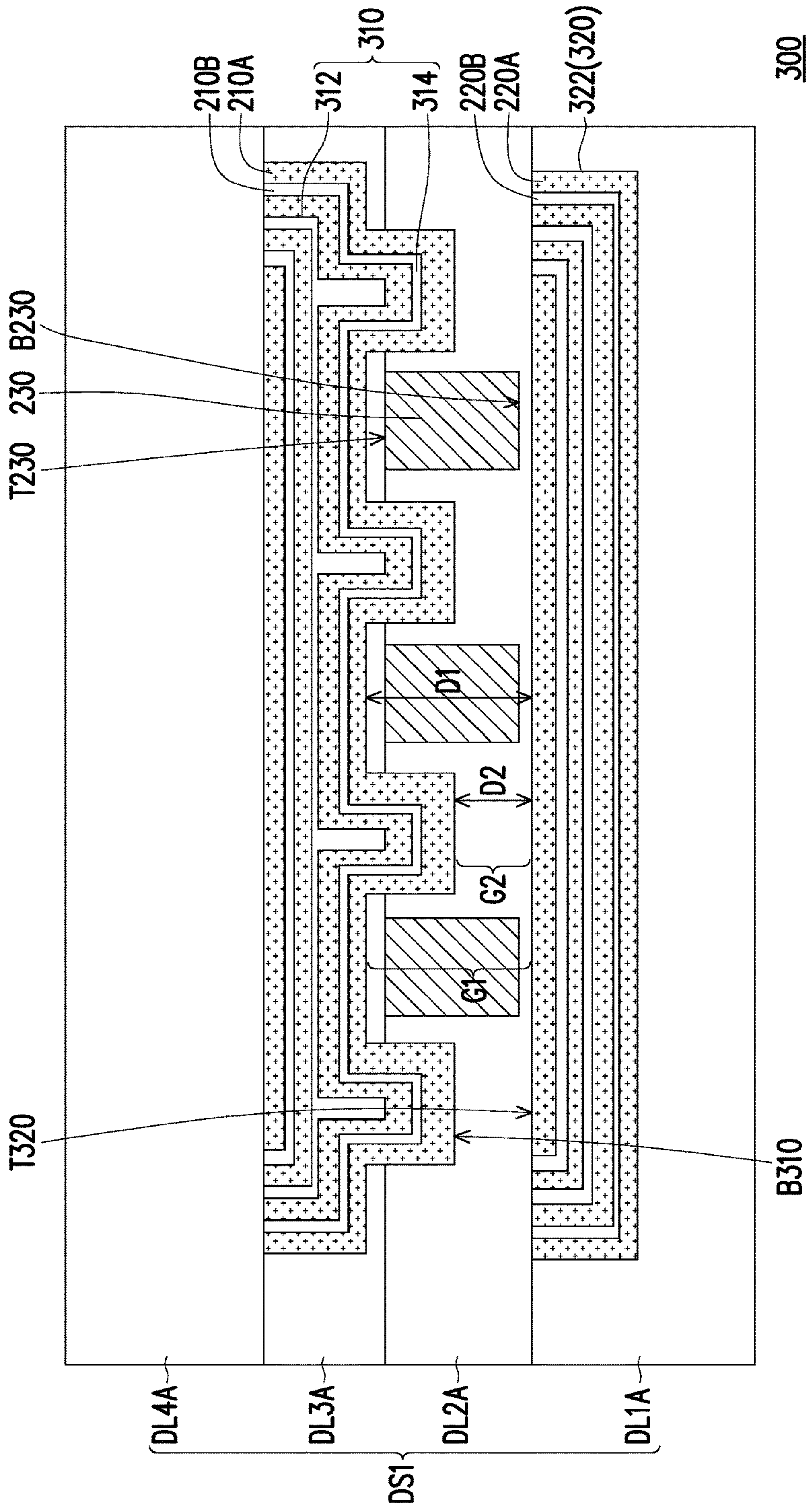
FIG. 7 schematically illustrates a cross sectional view of an embedded inductor of FIG. 6, taken along line III-III.
Figure 8:
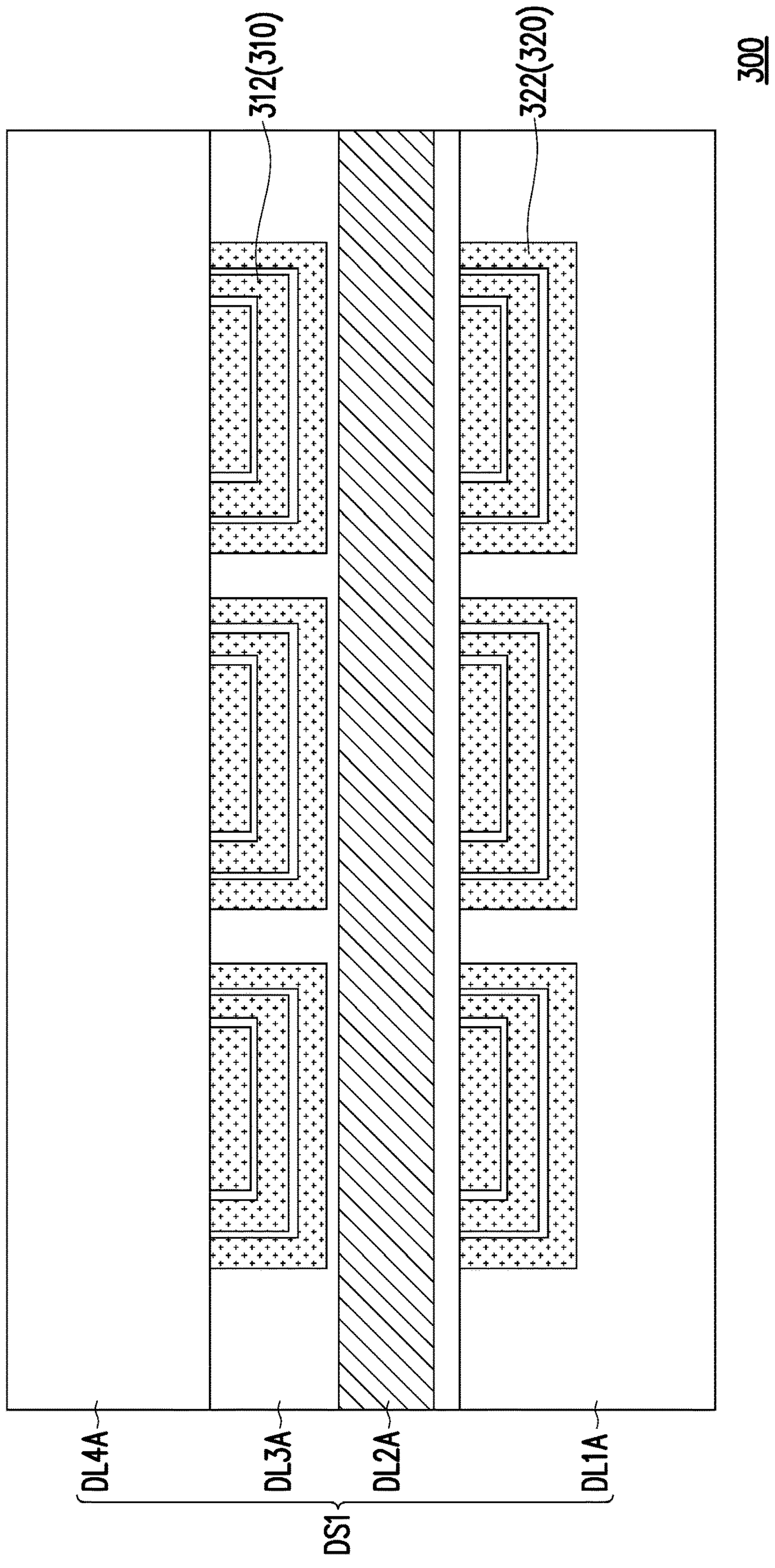
FIG. 8 schematically illustrates a cross sectional view of an embedded inductor of FIG. 6, taken along line IV-IV.

FIG. 6 schematically illustrates a top view of an embedded inductor in accordance with some embodiments of the disclosure, FIG. 7 schematically illustrates a cross sectional view of an embedded inductor of FIG. 6, taken along line III-III, and FIG. 8 schematically illustrates a cross sectional view of an embedded inductor of FIG. 6, taken along line IV-IV. An embedded inductor 300 may be applicable in the semiconductor device 100 depicted in FIG. 1 and includes a first magnetic core 310, a second magnetic core 320, and a conductor coil 230. The conductor coil 230 is disposed between the first magnetic core 310 and the second magnetic core 320, wherein the conductor coil 230 may refer to the conductor coil 230 depicted in the embodiment of the embedded inductor 200. The first magnetic core 310 includes a main portion 312 overlapping the conductor coil 230 and one or more protrusions 314 protruded from the main portion 312. The main portion 312 linearly extends in the X-axis and the protrusion 314 is protruded from the main portion 312 to a level between an upper surface T230 of the conductor coil 230 and a bottom surface B230 of the conductor coil 230. The second magnetic core 320 includes a main portion 322 that is arranged corresponding to the main portion 312 of the first magnetic core 310. For example, the main portion 322 is a linear structure corresponding to the main portion 312 of the first magnetic core 310. In some embodiments, the second magnetic core 320 may be replaced by the second magnetic core 220 of the embedded inductor 200. In some embodiments, the first magnetic core 310 may be replaced by the first magnetic core 210 of the embedded inductor 200.

In the embodiments, the embedded inductor 300, similar to the embedded inductor 200, is embedded in the dielectric structure DS1 including the dielectric layers DL1A~DL4A. The embedded inductor 300 may be fabricated by using similar process for fabricating the embedded inductor 200 that described in above. The first magnetic core 310 is formed by sub-layers of different materials stacked alternatively on one another. For example, the first magnetic core 310 includes first sub-layers 210A and second sub-layers 210B stacked alternatively on one another. Similarly, the second magnetic core 320 is formed by sub-layers of different materials stacked alternatively on one another, such as first sub-layers 220A and second sub-layers 220B. The first sub-layers 210A, the second sub-layers 210B, the first sub-layers 220A and the second sub-layers 220B may refer to the description in the embodiment of the embedded inductor 200.

The first magnetic core 310 of the embedded inductor 300 is different from the first magnetic core 210 of the embedded inductor 200 in the overall structure shape, wherein the first magnetic core 310 has a linear overall shape that the dimension L of the first magnetic core 310 in X-axis is obviously greater than that the dimension W in Y-axis. Similarly, the second magnetic core 320 of the embedded inductor 300 is different from the second magnetic core 220 of the embedded inductor 200 in the overall structure shape, wherein the second magnetic core 320 has a linear overall shape that the dimension L of the second magnetic core 320 in X-axis is obviously greater than that the dimension W in Y-axis.

The first magnetic core 310 has a staggered surface B310 facing the second magnetic core 320 and the second magnetic core 320 has a flat surface T320 facing the first magnetic core 310. A first gap region G1 and a second gap region G2 are defined between the first magnetic core 310 and the second magnetic core 320. The first gap region G1 and the second gap region G2 are alternatively arranged along the plane of X-axis and Y-axis. A spacing distance D1 between the first magnetic core 310 and the second magnetic core 320 in the first gap region G1 is greater than a spacing distance D2 between the first magnetic core 310 and the second magnetic core 320 in the second gap region G2. The conductor coil 230 is wounded in a coil path on the plane of X-axis and Y-axis as shown in FIG. 6 and the main portion 312 of the first magnetic core 310 is intersected with the routing path of the conductor coil 230. The conductor coil 230 is located within the first gap region G1 and the protrusion 314 of the first magnetic core 310 is located in the second gap region G2 so that the protrusion 314 is disposed outside the area of the conductor coil 230. As shown in FIG. 6, the protrusion 314 is not overlapped with the conductor coil 230.

Figure 9:
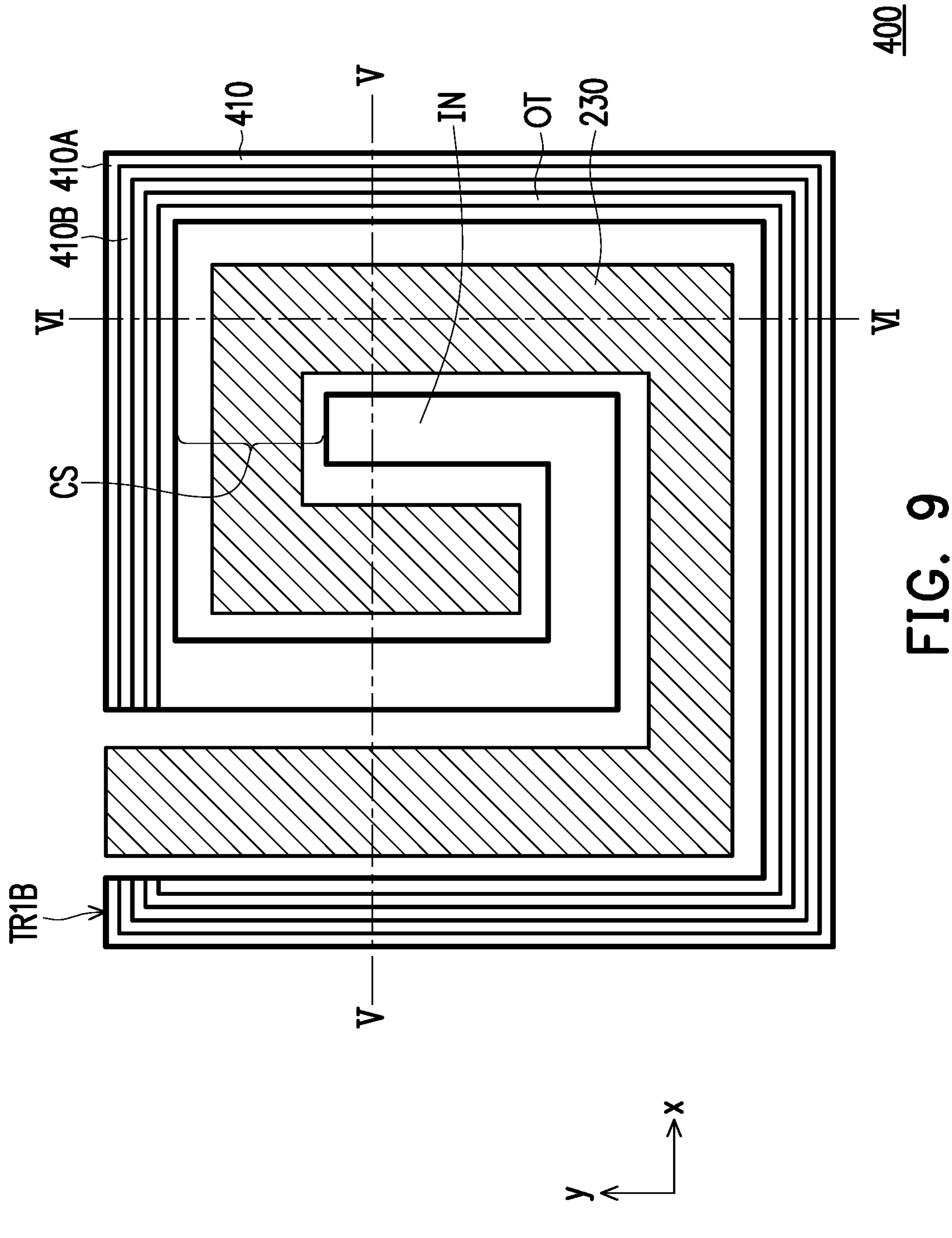
FIG. 9 schematically illustrates a top view of an embedded inductor in accordance with some embodiments of the disclosure.
Figure 10:
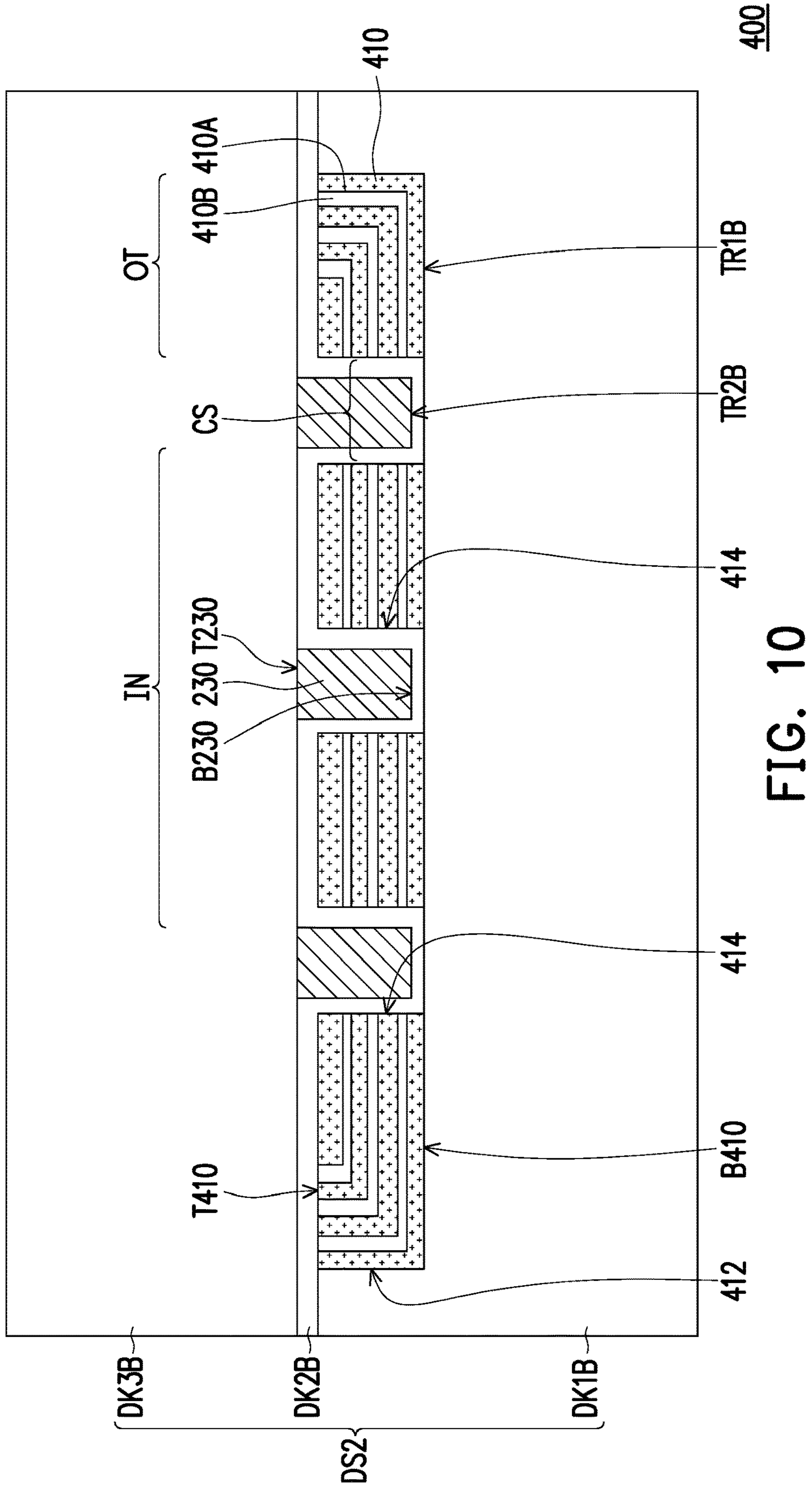
FIG. 10 schematically illustrates a cross sectional view of an embedded inductor of FIG. 9, taken along line V-V.
Figure 11:
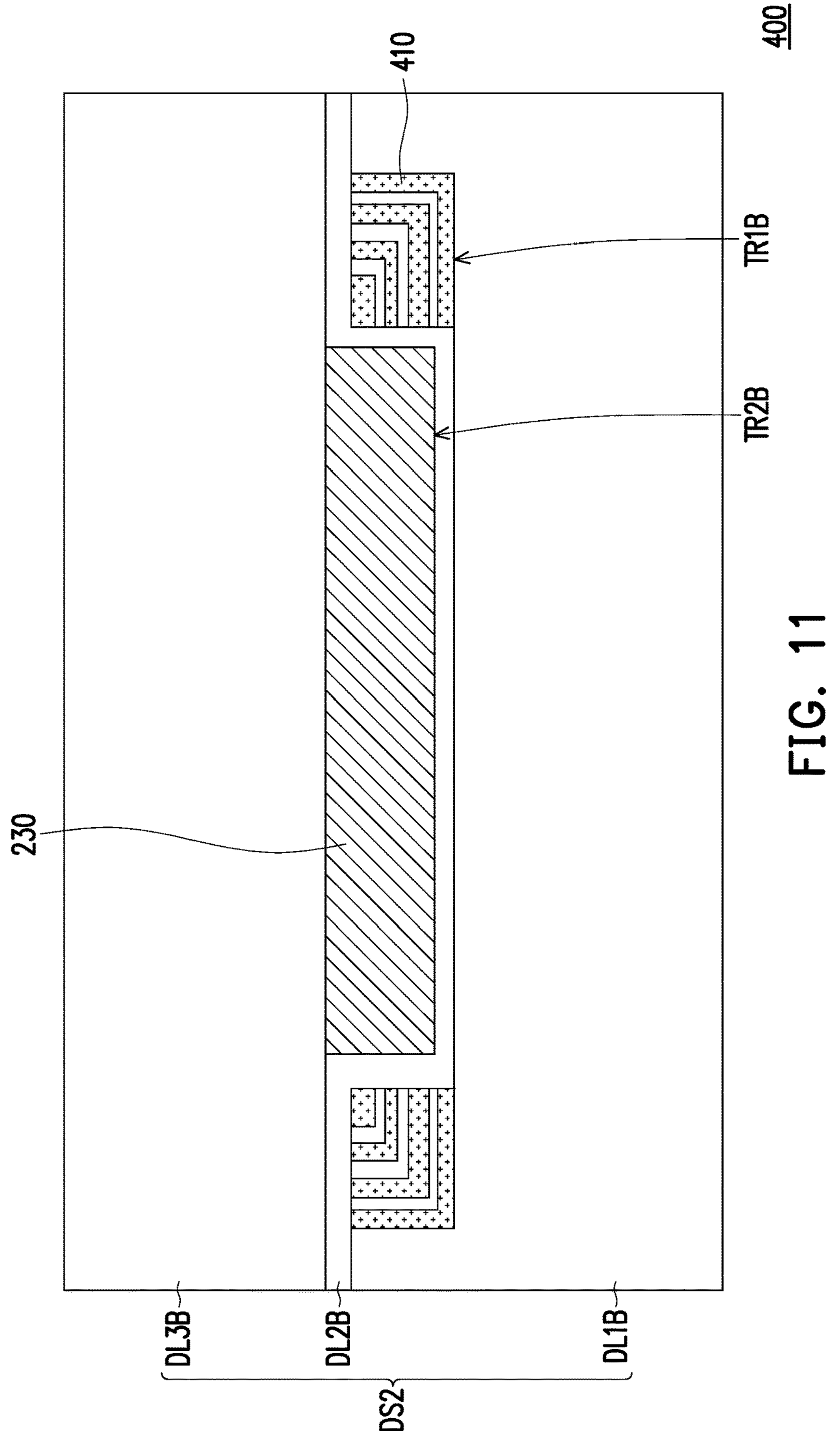
FIG. 11 schematically illustrates a cross sectional view of an embedded inductor of FIG. 9, taken along line VI-VI.

FIG. 9 schematically illustrates a top view of an embedded inductor in accordance with some embodiments of the disclosure, FIG. 10 schematically illustrates a cross sectional view of an embedded inductor of FIG. 9, taken along line V-V, and FIG. 11 schematically illustrates a cross sectional view of an embedded inductor of FIG. 9, taken along line VI-VI. An embedded inductor 400 includes a magnetic core 410 and a conductor coil 230, wherein the conductor coil 230 may refer to the conductor coil 230 depicted in the embodiment of the embedded inductor 200. The magnetic core 410 shown in the top view of FIG. 9 extends along a coil path in the top view. The coil path of the magnetic core 410 is wounded on the plane of X-axis and Y-axis and is corresponding to the conductor coil 230. The magnetic core 410 is spaced from the conductor coil 230 without overlapping the conductor coil 230. The magnetic core 410 is formed by sub-layers of different materials stacked alternatively on one another, and for example, the magnetic core 410 includes first sub-layers 410A and second sub-layers 410B alternatively on one another, wherein the first sub-layers 410A is made of a material different from the second sub-layers 410B. In some embodiments, the sub-layers of different materials for forming the magnetic core 410 may refer to the description of the embodiment of the embedded inductor 200. Each of the first sub-layers 410A and the second sub-layers 210B may extend to the same level at the upper surface T410 of the magnetic core 410.

In FIG. 10 and FIG. 11, the embedded inductor 400 is embedded in the dielectric structure DS2 including the dielectric layers DL1B~DL3B. The dielectric layer DL1B is pattern to have the trench TR1B and the magnetic core 410 is disposed in the trench TR1B. In some embodiments, the trench TR1B has a rectangular pattern in the top view. The magnetic core 410 formed in the trench TR1B is patterned from a rectangular pattern to the coil-like shape. Specifically, the first sub-layers 410A and the second sub-layers 410B are formed to fill the trench TR1B and then is patterned to the coil-like shape, such that the magnetic core 410 is formed. The magnetic core 410 may have outer sidewall 412 and inner sidewall 414, and each of the first sub-layers 410A and the second sub-layers 410B is cut at the inner sidewall 414. In some embodiments, only the bottom most one of the first sub-layers 410A extends along the outer sidewall 412, and the inner sidewall includes a cut edge of each of the first sub-layers 410A and the second sub-layers 410B. The first sub-layers 410A and the second sub-layers 410B may have L-shaped cross sectional structure at the outer portion OT of the magnetic core 410 and have horizontal cross sectional structure at the inner portion IN of the magnetic core 410. In some embodiments, in the top view as shown in FIG. 9, boundaries between the first sub-layers 410A and the second sub-layers 410B may be arranged in a concentric manner along the outer portion OT of the magnetic core 410 and the concentric patterns are corresponding to the shape of the trench TR1B. In addition, the inner sidewall 414 of the magnetic core 410 may define a coil space CS that is corresponding to the routing path of the magnetic core 410.

The dielectric layer DL2B is disposed on the magnetic core 410 and the dielectric layer DL1B. The dielectric layer DL2B fills the coil space CS and then patterned to have a trench TR2B. The trench TR2B is arranged along the coil space CS and the conductor coil 230 is formed in the trench TR2B to have the required coil shape. The dielectric layer DL2B is disposed between the magnetic core 410 and the conductor coil 230. The trench TR2B may extend to a level between the upper surface T410 of the magnetic core 410 and the bottom surface B410 of the magnetic core 410. In the cross sectional structure, the pattern of the magnetic core 410 and the pattern of the conductor coil 230 may be alternatively arranged on the plane of X-axis and Y-axis. In addition, the magnetic core 410 may partially extend to a level between the upper surface T230 and the bottom surface B230 of the conductor coil 230. The upper surface T410 of the magnetic core 410 may be co-leveled with the dielectric layer DLIB and the upper surface T230 of the conductor coil 230 may be co-leveled with the dielectric layer DL2B. The dielectric layer DL3B is disposed on the conductor coil 230 and the dielectric layer DL2B.

Figure 12:
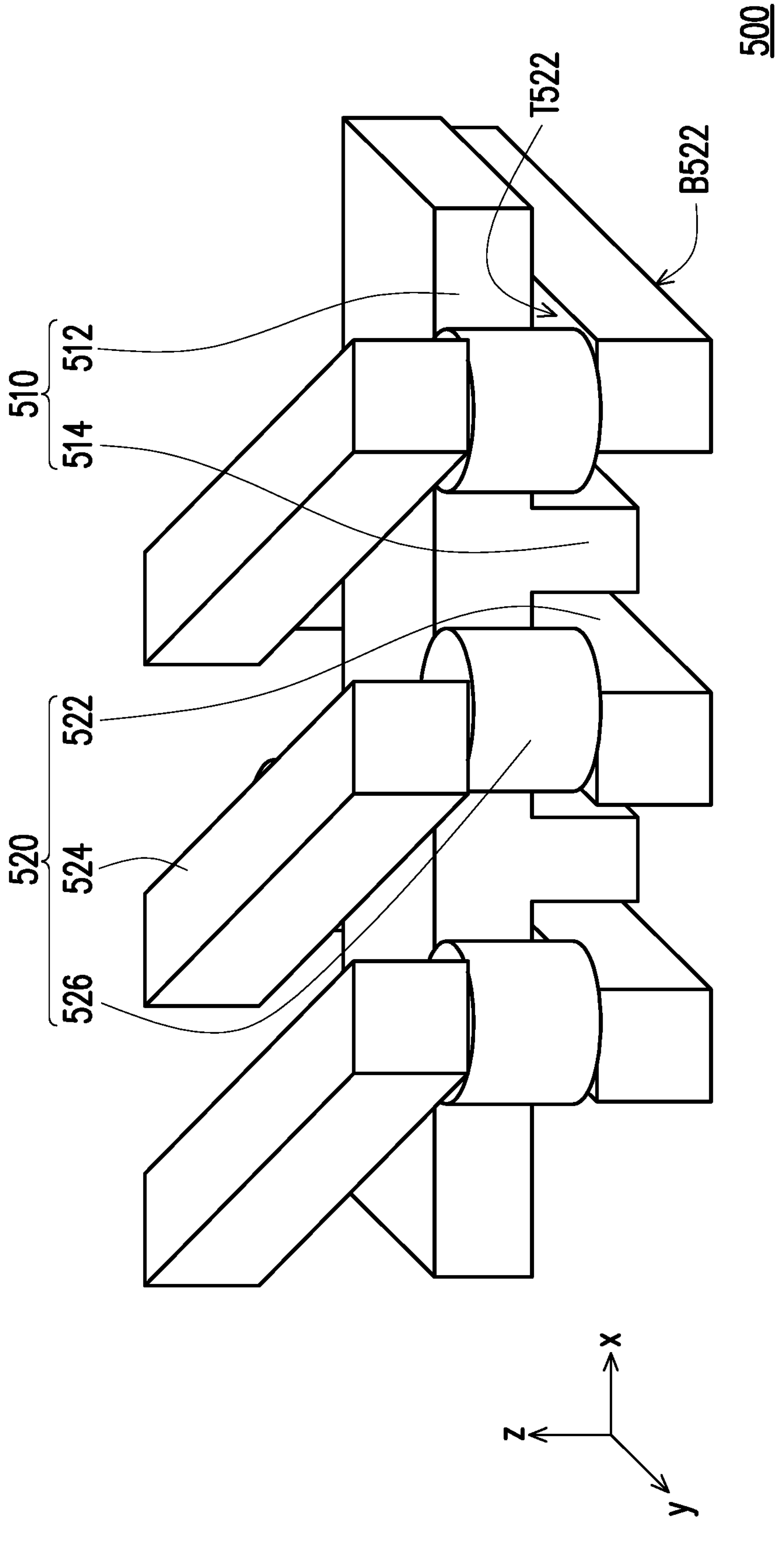
FIG. 12 schematically illustrates an exploded view of an embedded inductor in accordance with some embodiments of the disclosure.
Figure 13:
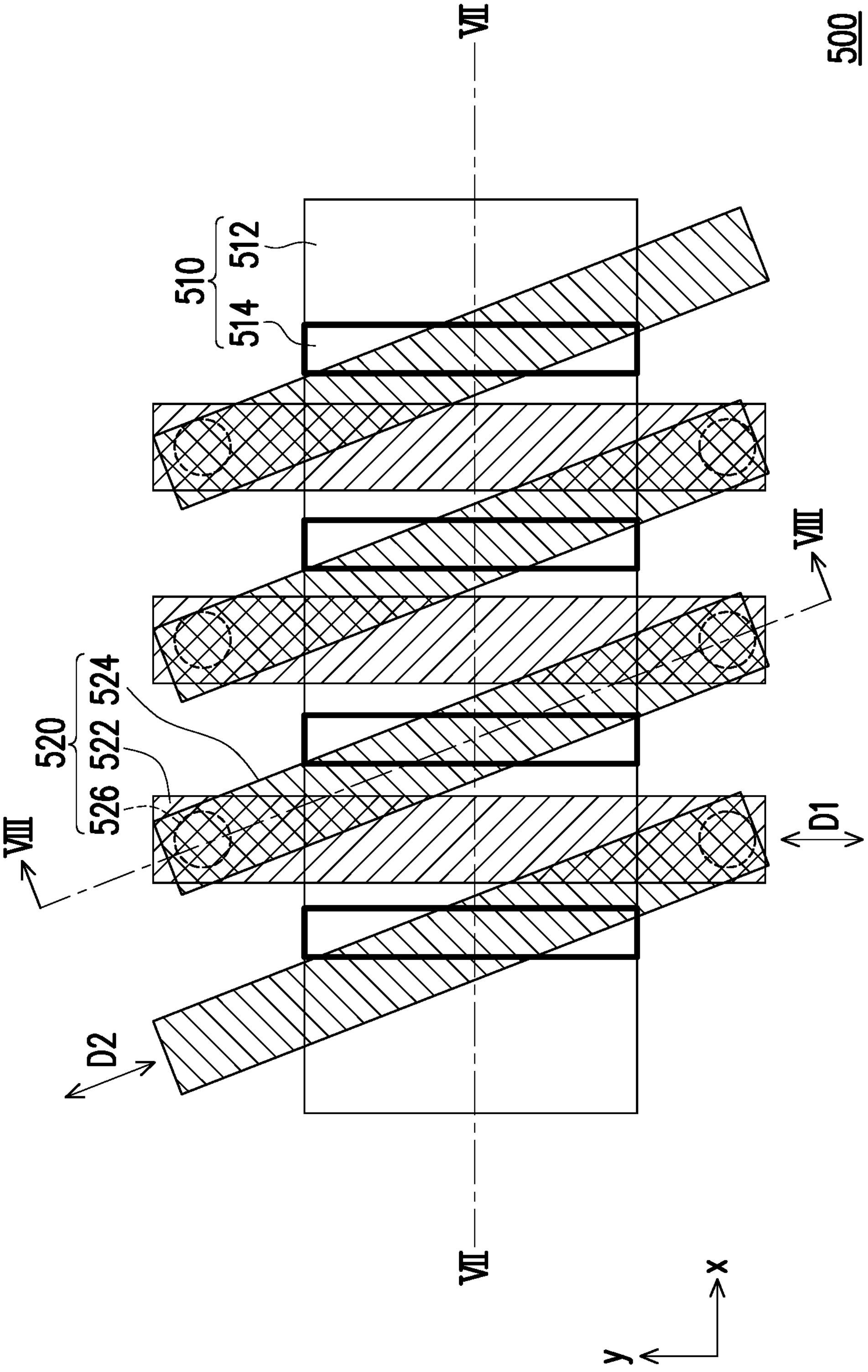
FIG. 13 schematically illustrates a top view of an embedded inductor in accordance with some embodiments of the disclosure.
Figure 14:
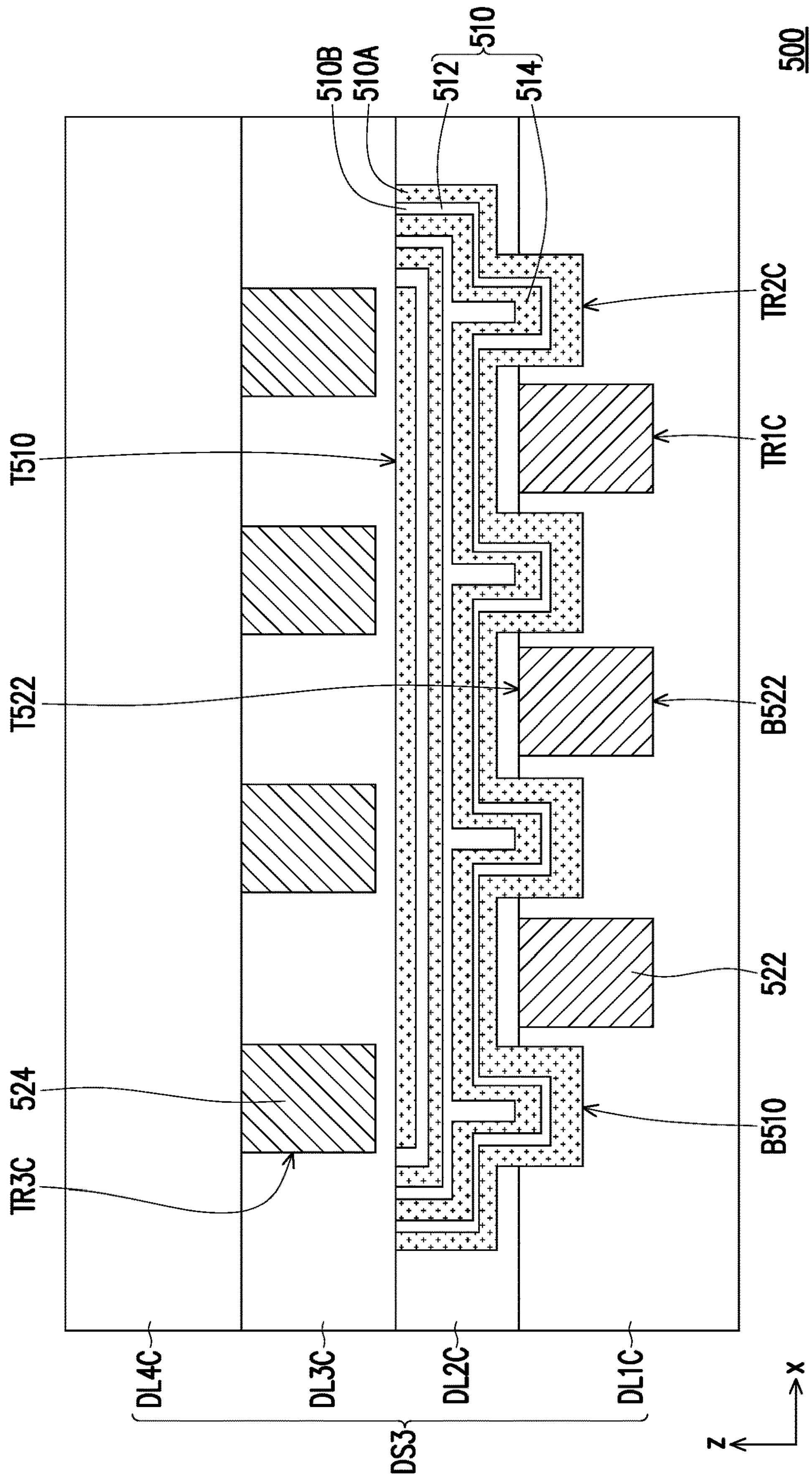
FIG. 14 schematically illustrates a cross sectional view of an embedded inductor, taken along line VII-VII of FIG. 13 in accordance with some embodiments of the disclosure.
Figure 15:
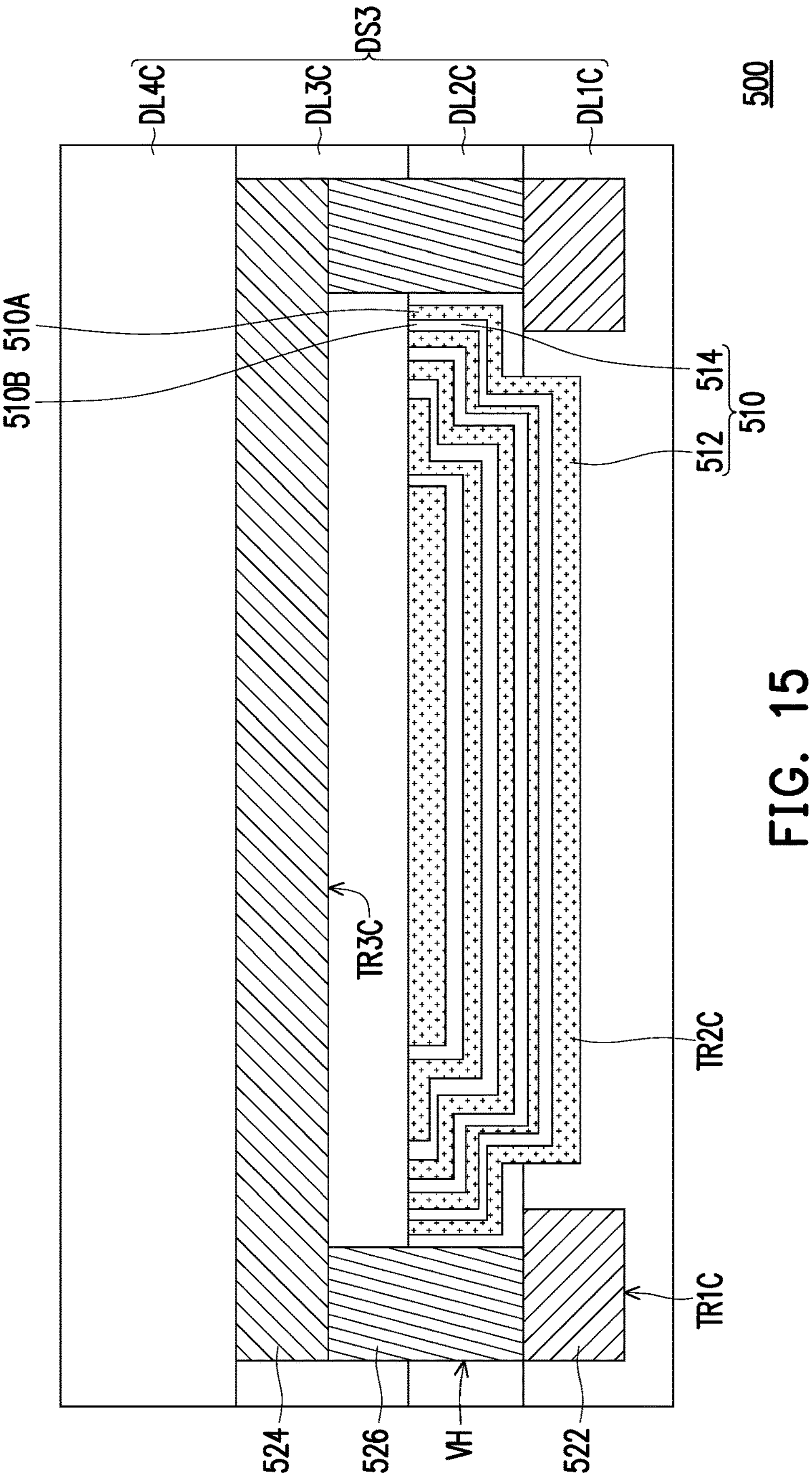
FIG. 15 schematically illustrates a cross sectional view of an embedded inductor, taken along line VIII-VIII of FIG. 13 in accordance with some embodiments of the disclosure.

FIGS. 12 to 15 schematically illustrate an embedded inductor in accordance with some embodiments of the disclosure. An embedded inductor 500 shown in FIG. 12 is applicable to the semiconductor device 100 of FIG. 1 to provide as an exemplary implement of the embedded inductor 140. The embedded inductor 500 may be disposed on the substrate 110 shown in FIG. 1 and embedded in the interconnect structure 130. The embedded inductor 500 includes a magnetic core 510 and a conductor coil 520 wounded about the magnetic core 510. As shown in FIG. 14 and FIG. 15, the embedded inductor 500 is embedded in the dielectric structure DS3 that includes dielectric layers DL1C~DL4C. In addition, the conductor coil 520 is wounded along a 3D (three dimensional) coil path to surround the magnetic core 510.

The conductor inductor 520 includes first wire sections 522, second wire sections 524 and conductor vias 526. The first wire sections 522 are parallel to each other and sequentially arranged along the elongation direction of the magnetic core 510. The second wire sections 524 are parallel to each other and sequentially arranged along the elongation direction of the magnetic core 510. Each of the first wire section 522 extends in a first direction on the plane of X-axis and Y-axis and each of the second wire section 524 extends in a second direction on the plane of X-axis and Y-axis, wherein the first direction is intersected with the second direction. For illustration purpose, the first direction is substantially parallel to Y-axis in the drawings. Each of the conductor vias 526 extends in Z-axis and connects between one of the first wire sections 522 and one of the second wire sections 524 to form the conductor coil 520.

The magnetic core 510 is located between the first wire sections 522 and the second wire sections 524 and the conductor coil 520 is wounded about the magnetic core 510 along the elongation direction of the magnetic core 510. The magnetic core 510 includes a main portion 512 that overlaps the conductor coil 520 and extends in the X-axis and a protrusion 514 protruded from the main portion 512. The elongation direction of the magnetic core 510 may be parallel to X-axis. The protrusions 514 extends to a level between an upper surface T522 of the wire section 522 and a bottom surface B522 of the wire section 522, such that the magnetic core 510 has a staggered surface B510 facing the wire section 522 of the conductor coil 520. The magnetic core 510 is formed by sub-layers of different materials stacked alternatively on one another. For example, the magnetic core 510 includes first sub-layers 510A and second sub-layers 510B that may be fabricated by using the method of fabricating the first sub-layers 210A and second sub-layers 210B described in the embodiment of the embedded inductor 200. In some embodiments, a portion of the sub-layers of different materials constructs the protrusion 514, and each of the sub-layers of different materials constructing the protrusion 514 has a U-shape cross section. In addition, the sub-layers of different material, such as the first sub-layer 510A and the second sub-layer 510B, extend to a same level at an upper surface T510 of the magnetic core 510.

In some embodiments, the magnetic core 510 and the wire sections 522 may be fabricated by the process of fabricating the first magnetic core 210 and the conductor coil 220 of the embedded inductor 200. For example, the dielectric layer DL1C is patterned to have the trench TR1C and the wire sections 522 are formed in the trench TRC1. The dielectric layer DL2C is disposed on the wire sections 522 and the dielectric layer DL1C and patterned to have the trench TR2C having two stairs. The magnetic core 510 is fabricated by alternatively forming the first sub-layers 510A and the second sub-layers 510B in the trench TR2C. The dielectric layer DL3C is formed on the magnetic core 510 and the dielectric layer DL2C and patterned to have the trench TR3C and via holes VH. The conductor via 526 is formed in the via hole VH and the wire section 524 is formed in the trench TR3. The dielectric layer DL4C is formed on the wire section 524 and the dielectric layer DL3C. A portion of the trench TR2C extends through the dielectric layer DL2C and reaches a level between the upper surface T522 of the wire section 522 and the bottom surface B522 of the wire section 522 so that the bottom surface of the magnetic core 510 is a staggered surface B510.

The protrusion 514 of the magnetic core 510 and the wire sections 522 are alternatively arranged on the plane of X-axis and Y-axis as shown in FIG. 13. The protrusion 514 is located outside the area of the wire section 522. The upper surface T510 of the magnetic core 510 is flat and co-leveled with the dielectric layer DL2C. Accordingly, the magnetic core 510 has an asymmetric structure about the plane of X-axis and Y-axis, which facilitates an anisotropic induction effect. In some embodiments, the plane of X-axis and Y-axis may be parallel to the substrate 110 of the semiconductor device 100 in FIG. 1, but the disclosure is not limited thereto.

Figure 16:
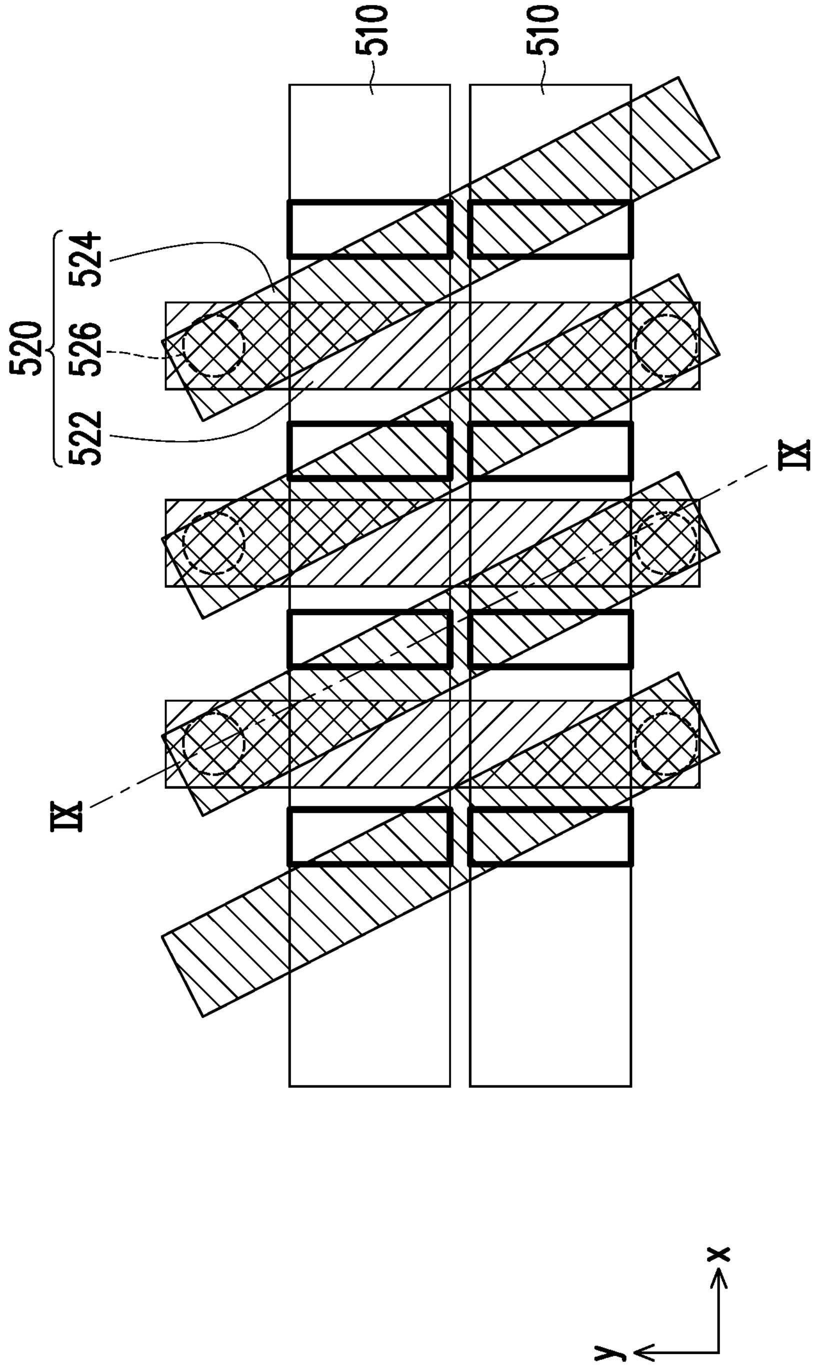
FIG. 16 schematically illustrates a top view of an embedded inductor in accordance with some embodiments of the disclosure.
Figure 17:
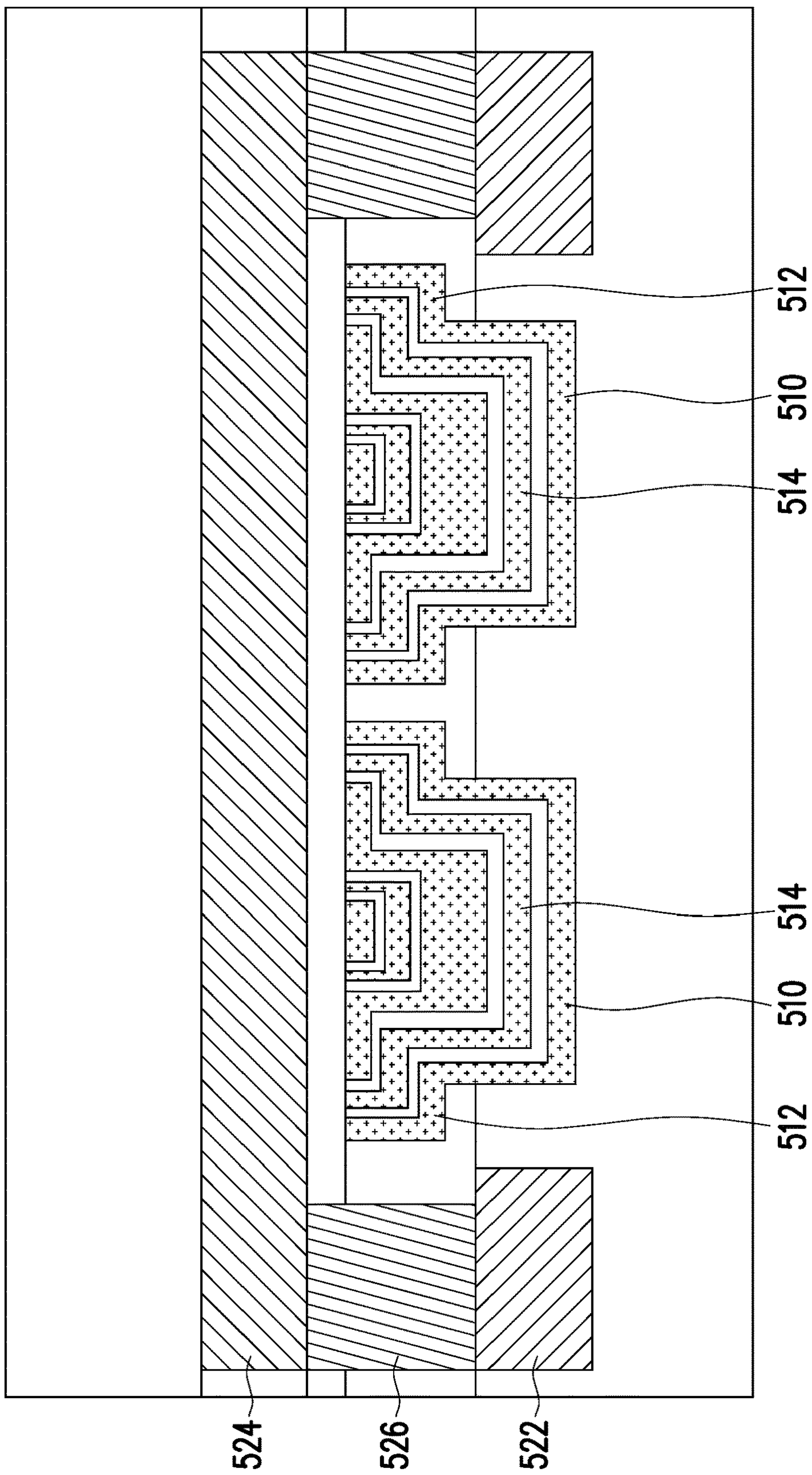
FIG. 17 schematically illustrates a cross sectional view of an embedded inductor of FIG. 16, taken along line IX-IX.
Figure 18:
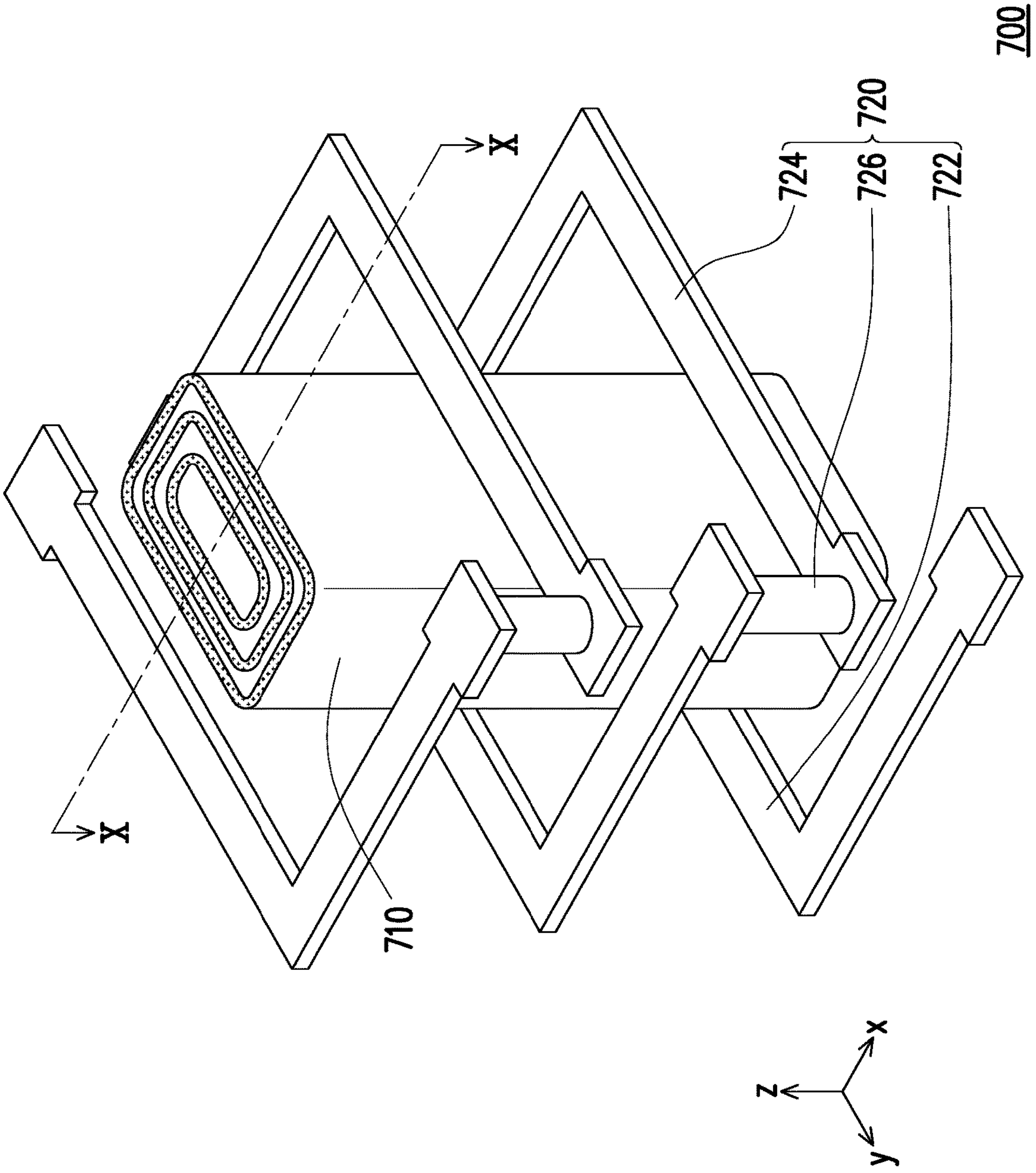
FIG. 18 schematically illustrates an embedded inductor in accordance with some embodiments of the disclosure.

FIG. 16 schematically illustrates a top view of an embedded inductor in accordance with some embodiments of the disclosure and FIG. 17 schematically illustrates a cross sectional view of an embedded inductor of FIG. 16, taken along line IX-IX. An embedded inductor 600 is similar to the embedded inductor 500. Specifically, the embedded inductor 600 includes two magnetic cores 510 and the conductor coil 520. The conductor coil 510 is wounded about the two of the magnetic cores 510. Each of the magnetic core 510 includes a main portion 512 and a protrusion 514. The conductor coil 520 includes wire sections 522, wire sections 524 and conductor vias 526. The details of the magnetic cores 510 and the conductor coil 520 may refer to the description of the embodiment of the embedded inductor 500. In brief, a difference between the embedded inductor 500 and the embedded inductor 600 is the quantity of the magnetic core 510.

Figure 19:
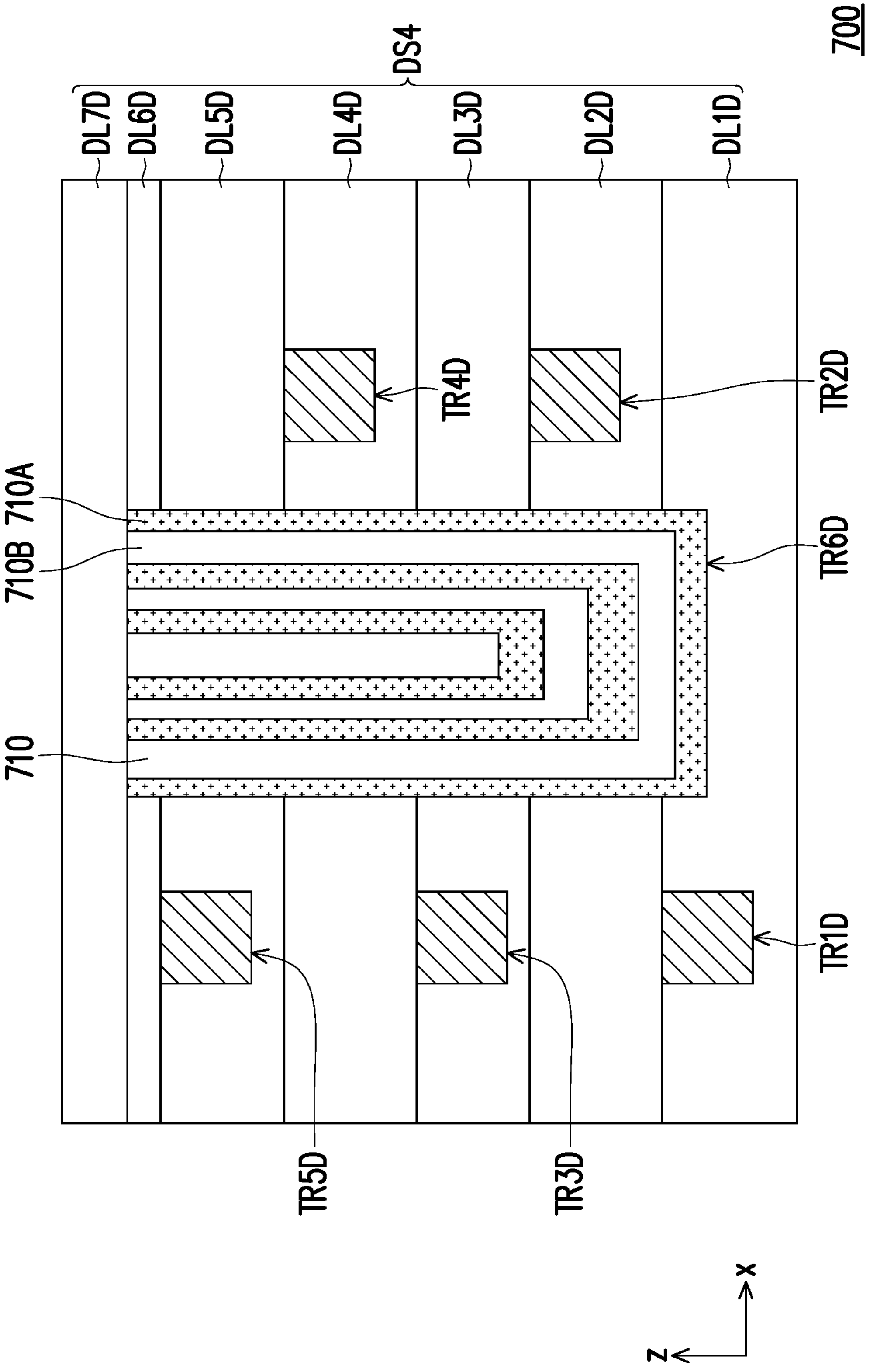
FIG. 19 schematically illustrates a cross sectional view of an embedded inductor of FIG. 18, taken along line X-X.

FIGS. 18 to 21 schematically illustrate an embedded inductor in accordance with some embodiments of the disclosure. An embedded inductor 700 is applicable to the semiconductor device 100 of FIG. 1 to provide as an exemplary implement of the embedded inductor 140. The embedded inductor 700 includes a magnetic core 710 arranged along an elongation direction substantially parallel to Z-axis, and a conductor coil 720 wounded along a 3D coil path about the magnetic core 710. The conductor coil 720 is wounded along a 3D coil path propagating in Z-axis and the magnetic core 710 is surrounded by the conductor coil 720. The conductor coil 720 includes a plurality of wire sections 722 and 724 parallel to each other and alternatively located at different levels along the elongation direction to surround the magnetic core 710, i.e. Z-axis. The conductor coil 720 also includes a plurality of conductor vias 726 connecting between the wire sections 722 and the wire sections 724. One of the wire sections 722 and a corresponding one of the wire sections 724 connected by one conductor via 726 are respectively located at opposite sides of the magnetic core 710. In addition, as shown in FIG. 19, the magnetic core 710 is formed by sub-layers of different materials stacked alternatively on one another, and for example, the magnetic core 710 includes first sub-layers 710A and second sub-layers 710B alternatively stacked on one another. Each of the first sub-layers 710A and the second sub-layers 710B has a U-shape cross sectional structure as shown in FIG. 19 and the first sub-layers 710A and the second sub-layers 710B form a concentric pattern in the top views shown in FIG. 18, FIG. 20 and FIG. 21.

The wire sections 722 and the wire sections 724 are wire structures arranged on the plane of X-axis and Y-axis. Three levels of wire sections 722 and two levels of wire sections 724 are presented in FIG. 18 and FIG. 19, and each of the conductor vias 726 extends in Z-axis to connect one wire section 722 to one wire section 724 to form the conductor coil 720. The embedded inductor 700 is embedded in the dielectric structure DS4 which may include dielectric layers DL1D~DL7D. The dielectric layer DL1D is patterned to form the trench TR1D and the first level of the wire section 722 is formed in the trench TR1D. The dielectric layer DL2D disposed on the first level of the wire section 722 is patterned to form the trench TR2D and the first level of the wire section 724 is formed in the trench TR2D. The dielectric layer DL3D disposed on the first level of the wire section 724 is patterned to form the trench TR3D and the second level of the wire section 722 is formed in the trench TR3D. The dielectric layer DL4D disposed on the second level of the wire section 722 is patterned to form the trench TR4D and the second level of the wire section 724 is formed in the trench TR4D. The dielectric layer DL5D disposed on the second level of the wire section 724 is patterned to form the trench TR5D and the third level of the wire section 722 is formed in the trench TR5D. In addition, after forming the dielectric layer DL6D on the third level of the wire section 722, a trench TR6D is formed extending from the upper surface of the dielectric layer DL6D to the dielectric layer DL1D. The magnetic core 710 is formed in the trench TR6D by alternatively stacking the first sub-layers 710A and the second sub-layers 710B. The first sub-layers 710A and the second sub-layers 710B may be made of different materials and all reach the level of the upper surface of the dielectric layer DL6D.

Figure 20:
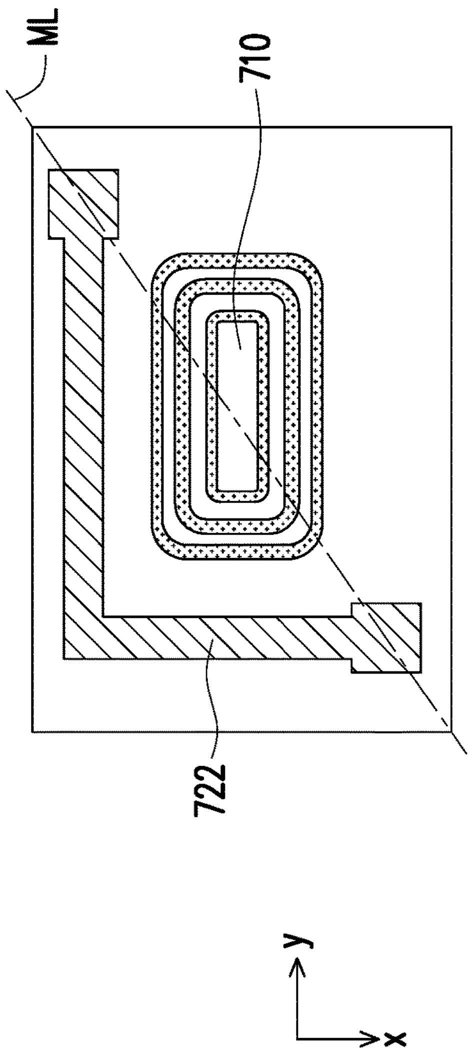
FIG. 20 schematically presents the top view of the wire section 722 and the magnetic core 710.
Figure 21:
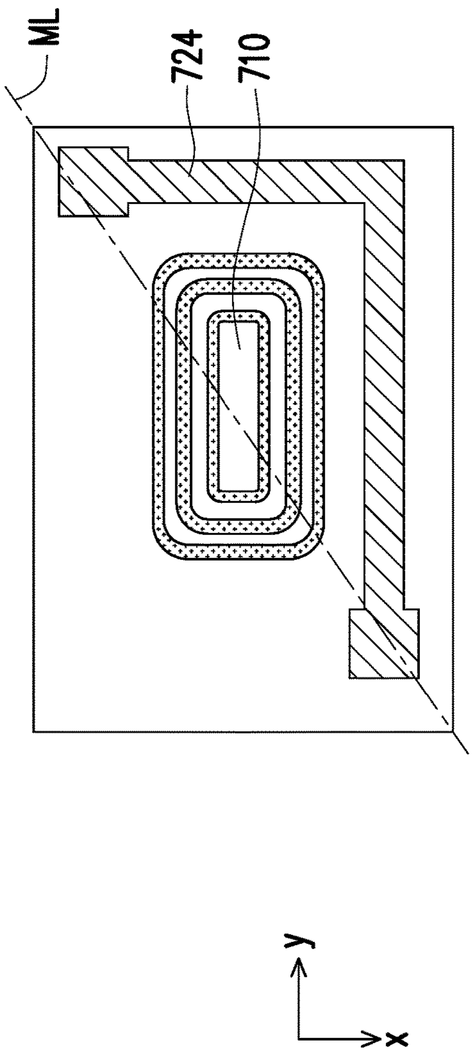
FIG. 21 schematically presents the top view of the wire section 724 and the magnetic core 710.

FIG. 20 schematically presents the top view of the wire section 722 and the magnetic core 710 and FIG. 21 schematically presents the top view of the wire section 724 and the magnetic core 710. As shown in FIG. 20 and FIG. 21, the wire section 722 partially surrounds the magnetic core 710 in a first angle range at a first side of the meet line ML and the wire section 724 partially surrounds the magnetic core 710 in a second angle range at a second side of the meet line ML. The path of the wire section 722 and the path of the wire section 724 may meet and/or overlap at the meet line ML. Therefore, the wire section 722 and the wire section 724 at different levels completely encircle the magnetic core 710. The conductor vias 726 extends in Z-axis to connect the wire section 722 and the wire section 724 at different levels.

Figure 22:
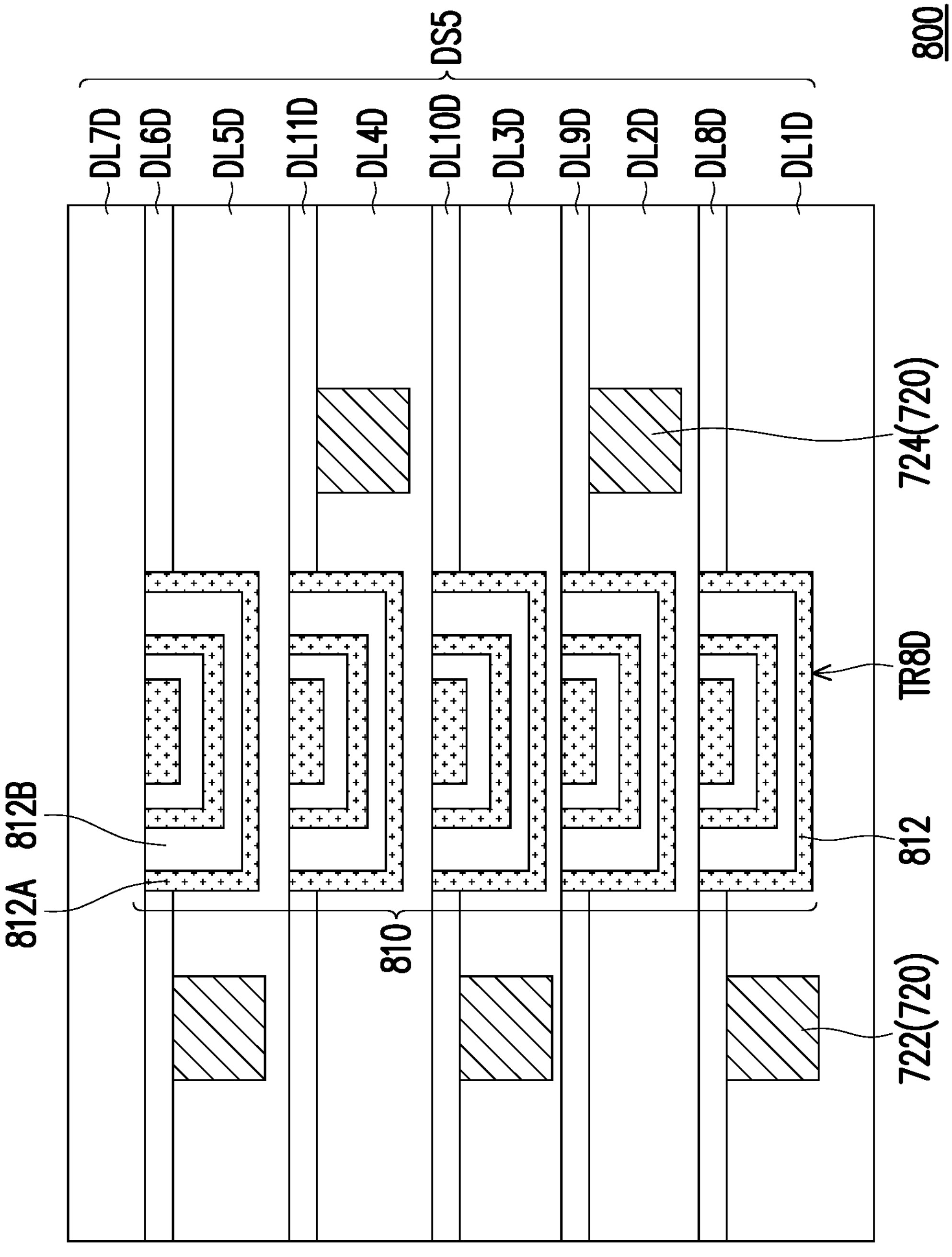
FIG. 22 schematically illustrates a cross sectional view of an embedded inductor in accordance with some embodiments of the disclosure.

FIG. 22 schematically illustrates an embedded inductor in accordance with some embodiments of the disclosure. An embedded inductor 800 is similar to the embedded inductor 700, and a difference of the embedded inductor 800 lies in the structure of the magnetic core. Specifically, the embedded inductor 800 is embedded in the dielectric structure DS5 including dielectric layers DL1D~DL11D and includes a magnetic core 810 and a conductor coil 720 that may refer to the conductor coil 720 described in the embodiment of the embedded inductor 700. Specifically, the magnetic core 810 may be applicable to the structure shown in FIG. 19 to provide an alternative implement of the magnetic core 710. In the embodiment, the magnetic core 810 having magnetic sections 812 arranged along the elongation direction of the magnetic core 810, e.g. Z-axis. Each of the magnetic sections 812 is formed by sub-layers of different materials stacked alternatively on one another and thus includes first sub-layers 812A and second sub-layers 812B stacked alternatively on one another. In some embodiments, each of the magnetic sections 812 may serve as one magnetic core and the embedded inductor 800 has multiple magnetic cores.

In some embodiments, the conductor coil 720 may be fabricated by the process described in the embodiment of the embedded inductor 700. The dielectric layer DL8D is formed on the dielectric layer DL1D to cover the first level of the wire section 722 of the conductor coil 720, the trench TR8D is formed extending from the dielectric layer DL8D to the dielectric layer DL1D, and the first level of the magnetic section 812 is formed in the trench TR8D by alternatively stacking the first sub-layers 812A and the second sub-layers 812B therein. The other levels of the magnetic sections 812 may be fabricated by using the same process, wherein the second level of the magnetic section 812 is formed after the dielectric layer DL9D covering the first level of the wire section 724 of the conductor coil 720, the third level of the magnetic section 812 is formed after the dielectric layer DL10D covering the second level of the wire section 722 of the conductor coil 720, the fourth level of the magnetic section 812 is formed after the dielectric layer DL11D covering the second level of the wire section 724 of the conductor coil 720, and the fifth level of the magnetic section 812 is formed after the dielectric layer DL6D covering the third level of the wire section 722 of the conductor coil 720 . . . . The dielectric layer DL9D is formed on the first level of the wire section 724, the dielectric layer DL10D is formed on the second level of the wire section 722, the dielectric layer DL11D is formed on the second level of the wire section 724, and the dielectric layer DL6D is formed on the third level of wire section 722. In addition, the dielectric layer DL7D is disposed on the dielectric layer DL6D and the fifth level of the magnetic section 812.

In view of the above, the semiconductor device in accordance with some embodiments of the disclosure may include one or more embedded inductor. The embedded inductor is formed and embedded in the interconnect structure that may be fabricated by the MEOL in the semiconductor manufacture field. The embedded inductor includes an asymmetric magnetic core and a conductor coil. The asymmetric magnetic core is formed by sub-layers of different materials stacked alternatively on one another. The embedded inductor in the semiconductor device may provide anisotropic induction effect that facilitates various applications.

In some embodiments of the disclosure, a semiconductor device includes a substrate; a magnetic core disposed on the substrate, formed by sub-layers of different materials stacked alternatively on one another; and a conductor coil disposed on the substrate, wherein the magnetic core partially extends to a level between an upper surface of the conductor coil and a bottom surface of the conductor coil. The conductor coil is wounded on a plane parallel to the substrate. The conductor coil is wounded around the magnetic core. The magnetic core has a staggered surface facing the conductor coil. The magnetic core includes a main portion overlapping the conductor coil, and a protrusion protruded from the main portion to the level between the upper surface of the conductor coil and the bottom surface of the conductor coil. A portion of the sub-layers of different materials constructs the protrusion, and each of the sub-layers of different materials constructing the protrusion has a U-shape cross section. The sub-layers of different materials extend to a same level at an upper surface of the magnetic core. The sub-layers of different materials include sub-layers of insulating material, sub-layers of conductive material, sub-layers of magnetic material, or a combination thereof. The sub-layers of magnetic material include sub-layers of ferromagnetic material, sub-layers of ferrite material, sub-layers of Heusler compounds, sub-layers of lanthanide elements, sub-layers of actinide element, or sub-layers of an oxide of ferromagnetic material. The magnetic core extends along a coil path corresponding to the conductor coil.

In some embodiments of the disclosure, a semiconductor device includes a substrate; a dielectric layer disposed on the substrate and including a trench; a magnetic core formed by sub-layers of different materials stacked alternatively on one another in the trench, wherein each of the sub-layers of different materials in the trench has a U-shape cross section in the trench; and a conductor coil disposed on the substrate, and wounded around the trench. The sub-layers of different materials extend to a same level of an upper surface of the dielectric layer. The conductor coil includes wire sections and conductor vias, the wire sections are parallel to each other and alternatively located at different levels, and the conductor vias connects between the wire sections. The dielectric layer covers one of the wire sections of the conductor coil. The wire sections are respectively located at opposite sides of the magnetic core.

In some embodiments of the disclosure, a semiconductor device includes a substrate; a first magnetic core disposed on the substrate; a second magnetic core disposed on the substrate, wherein a first gap region and a second gap region are defined between the first magnetic core and the second magnetic core, and a spacing distance between the first magnetic core and the second magnetic core is greater in the first gap region than in the second gap region; and a conductor coil disposed on the substrate, and located in the first gap region. The first magnetic core has a staggered surface facing the second magnetic core and the second magnetic core has a flat surface facing the first magnetic core. The first magnetic core is formed by sub-layers of different materials stacked alternatively on one another and the sub-layers of different materials extend to a same level at an upper surface of the first magnetic core. The second magnetic core is formed by sub-layers of different materials stacked alternatively on one another and the sub-layers of different materials extend to a same level at an upper surface of the second magnetic core. The first magnetic core includes a main portion overlapping the conductor coil and protrusions protruded from the main portion to a level between an upper surface of the conductor coil and a bottom surface of the conductor coil.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:

a substrate;

a first dielectric layer disposed on the substrate;

a second dielectric layer disposed on the first dielectric layer, wherein a first trench extends from a top surface of the first dielectric layer toward the substrate to a first level higher than a bottom surface of the first dielectric layer, a second trench extends from a top surface of the second dielectric layer toward the substrate to a second level higher than the bottom surface of the first dielectric layer and lower than the top surface of the first dielectric layer;

a magnetic core disposed on the substrate and filling the second trench, formed by sub-layers of different materials stacked alternatively on one another; and a conductor coil disposed on the substrate and filling the first trench, wherein the magnetic core partially extends to a level between an upper surface of the conductor coil and a bottom surface of the conductor coil.

2. The semiconductor device of claim 1, wherein the conductor coil is wounded on a plane parallel to the substrate.

3. The semiconductor device of claim 1, wherein the conductor coil is wounded around the magnetic core.

4. The semiconductor device of claim 1, wherein the magnetic core has a staggered surface facing the conductor coil.

5. The semiconductor device of claim 1, wherein the magnetic core comprises a main portion overlapping the conductor coil, and a protrusion protruded from the main portion to the level between the upper surface of the conductor coil and the bottom surface of the conductor coil.

6. The semiconductor device of claim 5, wherein a portion of the sub-layers of different materials constructs the protrusion, and each of the sub-layers of different materials constructing the protrusion has a U-shape cross section.

7. The semiconductor device of claim 1, wherein the sub-layers of different materials extend to a same level at an upper surface of the magnetic core.

8. The semiconductor device of claim 1, wherein the sub-layers of different materials comprise sub-layers of insulating material, sub-layers of conductive material, sub-layers of magnetic material, or a combination thereof.

9. The semiconductor device of claim 8, wherein the sub-layers of magnetic material comprise sub-layers of ferromagnetic material, sub-layers of ferrite material, sub-layers of Heusler compounds, sub-layers of lanthanide elements, sub-layers of actinide element, or sub-layers of an oxide of ferromagnetic material.

10. The semiconductor device of claim 1, wherein the magnetic core extends along a coil path corresponding to the conductor coil.

11. The semiconductor device of claim 1, wherein the conductor coil comprises wire sections, and the wire sections at adjacent levels are respectively located at opposite sides of the magnetic core.

12. A semiconductor device, comprising:

a substrate;

a dielectric layer disposed on the substrate, wherein a trench is formed in the dielectric layer;

a magnetic core formed by sub-layers of different materials stacked alternatively on one another in the trench, wherein each of the sub-layers of different materials in the trench has a U-shape cross section in the trench; and a conductor coil disposed on the substrate, and wounded around the trench, wherein the conductor coil comprises wire sections, and the wire sections at adjacent levels are respectively located at opposite sides of the magnetic core.

13. The semiconductor device of claim 12, wherein the sub-layers of different materials extend to a same level of an upper surface of the dielectric layer.

14. The semiconductor device of claim 12, wherein the conductor coil further comprises conductor vias, the wire sections are parallel to each other and alternatively located at different levels, and the conductor vias connects between the wire sections.

15. The semiconductor device of claim 14, wherein the dielectric layer covers one of the wire sections of the conductor coil.

16. A semiconductor device, comprising:

a substrate;

a first magnetic core disposed on the substrate;

a second magnetic core disposed on the substrate, wherein a first gap region and a second gap region are defined between the first magnetic core and the second magnetic core, and a spacing distance between the first magnetic core and the second magnetic core is greater in the first gap region than in the second gap region;

a conductor coil disposed on the substrate, and located in the first gap region; and a dielectric layer disposed between the first magnetic core and the second magnetic core, wherein top surfaces of the dielectric layer and the conductor coil are coplanar, the dielectric layer has a first trench filled by the conductive coil in the first gap region and a second trench filled by the first magnetic core in the second gap region, the dielectric layer has a first thickness under the first trench and a second thickness under the second trench, and first thickness is smaller than the second thickness.

17. The semiconductor device of claim 16, wherein the first magnetic core has a staggered surface facing the second magnetic core and the second magnetic core has a flat surface facing the first magnetic core.

18. The semiconductor device of claim 16, wherein the first magnetic core is formed by sub-layers of different materials stacked alternatively on one another and the sub-layers of different materials extend to a same level at an upper surface of the first magnetic core.

19. The semiconductor device of claim 16, wherein the second magnetic core is formed by sub-layers of different materials stacked alternatively on one another and the sub-layers of different materials extend to a same level at an upper surface of the second magnetic core.

20. The semiconductor device of claim 16, wherein the first magnetic core comprises a main portion overlapping the conductor coil and protrusions protruded from the main portion to a level between an upper surface of the conductor coil and a bottom surface of the conductor coil.

* * * * *